United States Patent
Nozawa

(10) Patent No.: US 10,847,669 B1
(45) Date of Patent: Nov. 24, 2020

(54) PHOTODETECTION ELEMENT INCLUDING PHOTOELECTRIC CONVERSION STRUCTURE AND AVALANCHE STRUCTURE

(71) Applicant: Panasonic Intellectual Property Management Co., Ltd., Osaka (JP)

(72) Inventor: Katsuya Nozawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/987,525

(22) Filed: Aug. 7, 2020

Related U.S. Application Data

(63) Continuation of application No. 15/993,552, filed on May 30, 2018.

(30) Foreign Application Priority Data

Jun. 23, 2017 (JP) .................. 2017-123210

(51) Int. Cl.
*H01L 31/107* (2006.01)
*H01L 51/42* (2006.01)
(Continued)

(52) U.S. Cl.
CPC .... *H01L 31/1075* (2013.01); *H01L 31/02027* (2013.01); *H01L 31/035218* (2013.01);
(Continued)

(58) Field of Classification Search
CPC .......................... H01L 31/02002–02005; H01L 31/02016–02019;
(Continued)

(56) References Cited

U.S. PATENT DOCUMENTS

| 8,772,729 B1 | 7/2014 | Brown et al. |
| 2005/0006678 A1 | 1/2005 | Tanaka et al. |

(Continued)

FOREIGN PATENT DOCUMENTS

| JP | 2003-023174 A | 1/2003 |
| JP | 2005-032843 A | 2/2005 |

(Continued)

OTHER PUBLICATIONS

Bednorz, Mateusz eta al., Silicon/organic hybrid heterojunction infrared photodetector operating in the telecom regime, 2013, Organic Electronics 14, pp. 1344-1350. (Year: 2013).

(Continued)

*Primary Examiner* — Robert G Bachner
*Assistant Examiner* — Molly K Reida
(74) *Attorney, Agent, or Firm* — McDermott Will & Emery LLP

(57) ABSTRACT

A photodetection element includes: a photoelectric conversion structure that contains a first material having an absorption coefficient higher than an absorption coefficient of monocrystalline silicon for light of a first wavelength, for which monocrystalline silicon exhibits absorption, and generates positive and negative charges by absorbing a photon; and an avalanche structure that includes a monocrystalline silicon layer, in which avalanche multiplication occurs as a result of injection of at least one selected from the group consisting of the positive and negative charges from the photoelectric conversion structure. The first material includes at least one selected from the group consisting of an organic semiconductor, a semiconductor-type carbon nanotube, and a semiconductor quantum dot.

7 Claims, 8 Drawing Sheets

(51) Int. Cl.
  *H01L 31/0352*  (2006.01)
  *H01L 31/0256*  (2006.01)
  *H01L 27/30*  (2006.01)
  *H01L 51/44*  (2006.01)
  *H01L 31/02*  (2006.01)
  *H01L 51/00*  (2006.01)

(52) U.S. Cl.
  CPC ........ *H01L 31/107* (2013.01); *H01L 51/4213* (2013.01); *H01L 27/307* (2013.01); *H01L 51/0036* (2013.01); *H01L 51/0038* (2013.01); *H01L 51/0043* (2013.01); *H01L 51/0047* (2013.01); *H01L 51/0048* (2013.01); *H01L 51/0078* (2013.01); *H01L 51/44* (2013.01); *H01L 2031/0344* (2013.01)

(58) Field of Classification Search
  CPC .......... H01L 31/02024–02027; H01L 31/0224–022416; H01L 31/022466–022491; H01L 31/09–119; H01L 31/0328; H01L 31/0336; H01L 31/0344; H01L 31/035209–035227; H01L 31/105; H01L 31/107; H01L 31/1075
  See application file for complete search history.

(56) References Cited

U.S. PATENT DOCUMENTS

| | | |
|---|---|---|
| 2005/0051861 A1 | 3/2005 | Shi et al. |
| 2010/0019334 A1 | 1/2010 | Ivanov et al. |
| 2012/0063789 A1 | 3/2012 | Yuan et al. |

FOREIGN PATENT DOCUMENTS

| | | |
|---|---|---|
| JP | 2012-069944 A | 4/2012 |
| JP | 2012-119311 A | 6/2012 |
| JP | 2014-042011 A | 3/2014 |
| JP | 2017-059601 A | 3/2017 |
| WO | 2017/081831 A1 | 5/2017 |

OTHER PUBLICATIONS

Amrosio, M. et al., Nano-materials and Nano-Technologies for novel photon detection systems, 2009, IEEE. (Year: 2009).

Levell, J.W. et al.; A hybrid organic semiconductor/silicon photodiode for efficient ultraviolet photodetection, Optics Express, vol. 18, No. 4, pp. 3219-3225. (Year: 2010).

Joel Q. Grim et al., "A sustainable future for photonic colloidal nanocrystals", Chemical Society Review, 2015, 44, Jun. 18, 2015, pp. 5897-5914.

Zhihong Huang et al., "25 Gbps low-voltage waveguide Si—Ge avalanche photodiode", optica, vol. 3, No. 8, Jul. 21, 2016, pp. 793-798.

Notice of Allowance issued in related U.S. Appl. No. 15/933,552, dated May 26, 2020.

Final Office Action issued in related U.S. Appl. No. 15/933,552, dated Feb. 18, 2020.

Non-Final Office Action issued in related U.S. Appl. No. 15/933,552, dated Jun. 11, 2019.

PHOTODETECTION ELEMENT INCLUDING PHOTOELECTRIC CONVERSION STRUCTURE AND AVALANCHE STRUCTURE

CROSS-REFERENCE OF RELATED APPLICATIONS

This application is a Continuation of U.S. patent application Ser. No. 15/993,552, filed on May 30, 2018, which claims the benefit of Japanese Application No. 2017-123210, filed on Jun. 23, 2017, the entire disclosures of which Applications are incorporated by reference herein.

BACKGROUND

1. Technical Field

The present disclosure relates to a photodetection element.

2. Description of the Related Art

An avalanche photodiode is known as a high-sensitivity photodetection element. The avalanche photodiode includes a multiplication region, to which a high electric field is applied when the avalanche photodiode is in operation, and multiplies charge generated through photoelectric conversion using an avalanche effect in the multiplication region. Japanese Unexamined Patent Application Publication No. 2005-32843 discloses an avalanche photodiode as a light receiving element for infrared communication. The avalanche photodiode disclosed in Japanese Unexamined Patent Application Publication No. 2005-32843 includes, as a photoelectric conversion layer, an InGaAs optical absorption layer. Z. Huang et al., "25 Gbps low-voltage waveguide Si—Ge avalanche photodiode", Optica, July 2016, Vol. 3, No. 8, pp. 793-798 discloses an Si—Ge avalanche photodiode having a single-crystal germanium layer functioning as an optical absorption layer and a waveguide which is formed on a monocrystalline silicon layer as a multiplication layer.

Application of avalanche photodiodes to an image sensor through integration is under consideration in addition to use of an avalanche photodiode as a discrete device. Japanese Unexamined Patent Application Publication No. 2012-119371 proposes use of an avalanche effect in a direct-conversion flat panel detector for radiography. FIG. 1 of Japanese Unexamined Patent Application Publication No. 2012-119371 discloses a radiation detector having an avalanche layer arranged adjacent to a photoelectric conversion layer composed mainly of amorphous Se. The radiation detector according to Japanese Unexamined Patent Application Publication No. 2012-119371 provides an intensity image associated with radiation after passage through a subject.

SUMMARY

In one general aspect, the techniques disclosed here feature a photodetection element including: a photoelectric conversion structure that contains a first material having an absorption coefficient higher than an absorption coefficient of monocrystalline silicon for light of a first wavelength, for which monocrystalline silicon exhibits absorption, and generates positive and negative charges by absorbing a photon; and an avalanche structure that includes a monocrystalline silicon layer, in which avalanche multiplication occurs as a result of injection of at least one selected from the group consisting of the positive and negative charges from the photoelectric conversion structure. The first material includes at least one selected from the group consisting of an organic semiconductor, a semiconductor-type carbon nanotube, and a semiconductor quantum dot.

It should be noted that general or specific embodiments may be implemented as an element, a device, an apparatus, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
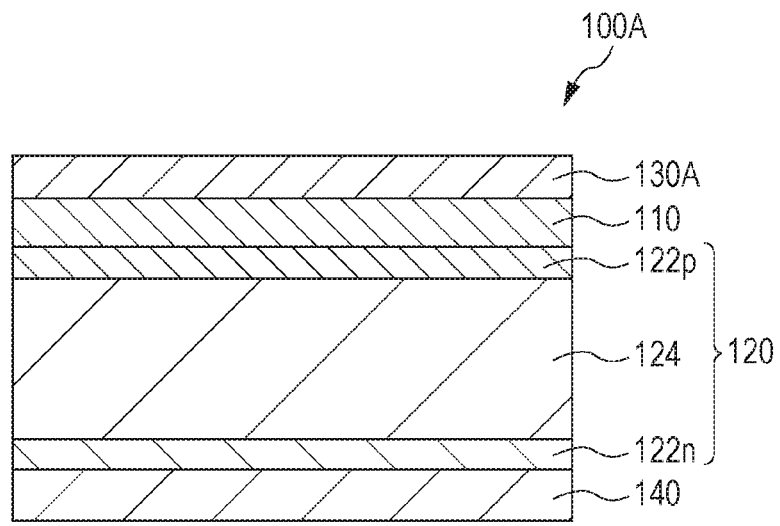
FIG. 1 is a view showing an exemplary device structure of a photodetection element according to a first embodiment.

Underlying Knowledge Forming Basis of the Present Disclosure

An avalanche photodiode can obtain a high signal level even on incidence of feeble light with a charge multiplying function. However, it is known that charges can be trapped in a structure of the avalanche photodiode. A factor in charges being trapped in the structure is the presence of an energy level resulting from a crystal defect, a crystal grain boundary, impurities, or the like. Such an energy level is also called a trap. A charge trapped in the structure is emitted with a certain probability after passage of time. A charge emitted from the trap after passage of a certain time is indistinguishable from a charge which is generated through photoelectric conversion in the same place at a time when the charge is emitted from the trap. For this reason, if charges trapped in the structure and emitted after passage of a certain time transfer to a multiplication region, charge multiplication occurs at a time later than light incidence.

In a case where an avalanche photodiode is brought into operation in linear mode, when a charge trapped in a structure is emitted after passage of a certain time, an attenuated signal is output from the avalanche photodiode at a time later than an intended time of light incidence. Such a signal output later than originally intended becomes a factor in reducing an S/N ratio of the avalanche photodiode. For example, if an image sensor is constructed by integrating avalanche photodiodes, a signal output later may appear as an afterimage in an image.

In a case where an avalanche photodiode is brought into operation in Geiger mode, when charges emitted from a trap transfer to a multiplication region, multiplication is triggered by injection of the charges into the multiplication region, and an output pulse is observed at a time different from an intended time of light incidence. The output pulse is a false signal which is indistinguishable from an intended output pulse generated as a result of light incidence. Such a false signal resulting from transfer of a charge trapped in a structure to an avalanche region is called an afterpulse. Since even incidence of a single photon may cause a transition to an avalanche breakdown state in Geiger mode, it is beneficial to reduce charges trapped in a structure.

The present disclosure provides a high-sensitivity photodetection element that has reduced noise while utilizing an avalanche effect.

Non-limiting exemplary embodiments of the present disclosure provide the following items.

[Item 1]

A photodetection element according to one aspect of the present disclosure includes a photoelectric conversion structure that contains a first material having an absorption coefficient higher than an absorption coefficient of monocrystalline silicon for light of a first wavelength, for which monocrystalline silicon exhibits absorption, and generates positive and negative charges by absorbing a photon, and an avalanche structure that includes a monocrystalline silicon layer, in which avalanche multiplication occurs as a result of injection of at least one selected from the group consisting of the positive and negative charges from the photoelectric conversion structure.

The first material includes at least one selected from the group consisting of an organic semiconductor, a semiconductor-type carbon nanotube, and a semiconductor quantum dot.

The configuration according to Item 1 allows charges to be inhibited from being trapped in the avalanche structure and allows provision of a high-sensitivity photodetection element that has inhibited generation of an afterimage and an afterpulse. The configuration according to Item 1 uses, for multiplication, charges generated in the photoelectric conversion structure containing the first material, which improves flexibility in designing a wavelength of light targeted for detection.

[Item 2]

In the photodetection element according to Item 1, the photoelectric conversion structure may be in direct contact with the avalanche structure.

[Item 3]

The photodetection element according to Item 1 may further include a charge transport layer that is arranged between the photoelectric conversion structure and the avalanche structure and allows at least one selected from the group consisting of the positive and negative charges generated in the photoelectric conversion structure to pass through.

The configuration according to Item 3 allows selective transfer of one of the positive and negative charges generated in the photoelectric conversion structure to the avalanche structure.

[Item 4]

The photodetection element according to any one of Items 1 to 3 may further include a first electrode, and a second electrode.

The avalanche structure may include a first heavily doped region of a first conductivity type, a second heavily doped region of a second conductivity type, and a lightly doped region that is arranged between the first heavily doped region and the second heavily doped region.

An impurity concentration of the lightly doped region may be lower than an impurity concentration of the first heavily doped region and an impurity concentration of the second heavily doped region.

The first electrode may be electrically connected to the first heavily doped region, and the second electrode may be electrically connected to the second heavily doped region.

In the photodetection element according to Item 4, the avalanche structure may further include a moderately doped region of the second conductivity type that is located inside the lightly doped region and is adjacent to the first heavily doped region, and an impurity concentration of the moderately doped region may be higher than the impurity concentration of the lightly doped region and be lower than the impurity concentration of the first heavily doped region.

[Item 5]

The photodetection element according to any one of Items 1 to 3 may further include a first electrode, and a second electrode.

In a cross section perpendicular to a surface of the avalanche structure, neither of a first straight line and a second straight line that extend from a given point inside the avalanche structure may cross the photoelectric conversion structure, the first straight line being an imaginary straight line extending from the given point inside the avalanche structure to a point inside the first electrode that is closest to the given point, the second straight line being an imaginary straight line extending from the given point to a point inside the second electrode that is closest to the given point.

In the configuration according to Item 5, a transfer pathway for a charge that is accelerated due to a difference in applied potential between the first electrode and the second electrode does not cross the photoelectric conversion structure. This allows reduction in charges passing through the photoelectric conversion structure and reduction in a probability of charges being trapped in the photoelectric conversion structure. The configuration according to Item 5 is particularly capable of more beneficially inhibiting generation of an afterpulse during operation in Geiger mode.

[Item 6]

The photodetection element according to Item 5 may further include
 a third electrode that is located on an opposite side of the photoelectric conversion structure from the avalanche structure, and
 a reset circuit that supplies a reset voltage that diselectrifies the photoelectric conversion structure to at least one selected from the group consisting of the first electrode, the second electrode, and the third electrode.

The configuration according to Item 6 allows a counter charge in the photoelectric conversion structure to be canceled out.

[Item 7]

The photodetection element according to Item 6 may further include
 a first charge transport layer that is arranged between the photoelectric conversion structure and the avalanche structure and selectively allows one of the positive and negative charges generated in the photoelectric conversion structure to pass through, and
 a second charge transport layer that is located between the photoelectric conversion structure and the third electrode and selectively allows the other of the positive and negative charges generated in the photoelectric conversion structure to pass through.

The reset circuit may be connected to the third electrode.

The configuration according to Item 7 selectively allows one of positive and negative charges generated through photoelectric conversion to transfer to the avalanche structure.

[Item 8]

The photodetection element according to any one of Items 1 to 3 may further include
 a first electrode,
 a second electrode, and
 a dielectric region.

In a cross section perpendicular to a surface of the avalanche structure, at least one straight line selected from the group consisting of a first straight line and a second straight line that extend from a given point inside the avalanche structure may cross the photoelectric conversion structure, the first straight line being an imaginary straight line extending from the given point inside the avalanche structure to a point inside the first electrode that is closest to the given point, the second straight line being an imaginary straight line extending from the given point to a point inside the second electrode that is closest to the given point, and
 at least a part of the dielectric region may be located on the at least one straight line.

The configuration according to Item 8 allows charges that are accelerated due to a difference in applied potential between the first electrode and the second electrode to be inhibited from transferring across the photoelectric conversion structure and allows reduction in a probability of charges being trapped in the photoelectric conversion structure.

[Item 9]

The photodetection element according to Item 8 may further include
 a third electrode that is located on an opposite side of the photoelectric conversion structure from the avalanche structure, and
 a reset circuit that supplies a reset voltage that diselectrifies the photoelectric conversion structure to at least one selected from the group consisting of the first electrode, the second electrode, and the third electrode.

The configuration according to Item 9 allows a counter charge in the photoelectric conversion structure to be canceled out.

[Item 10]

The photodetection element according to Item 9 may further include
 a first charge transport layer that is arranged between the photoelectric conversion structure and the avalanche structure and selectively allows one of the positive and negative charges generated in the photoelectric conversion structure to pass through, and
 a second charge transport layer that is located between the photoelectric conversion structure and the third electrode and selectively allows the other of the positive and negative charges generated in the photoelectric conversion structure to pass through.

The reset circuit may be connected to the third electrode.

The configuration according to Item 10 selectively allows one of positive and negative charges generated through photoelectric conversion to transfer to the avalanche structure.

[Item 11]

In the photodetection element according to any one of Items 1 to 10,
 an absorption edge of the first material may be located on a side longer in wavelength than an absorption edge of monocrystalline silicon.

The configuration according to Item 11 allows detection of, for example, light in a near-infrared region.

[Item 12]

In the photodetection element according to any one of Items 1 to 11,
 the photoelectric conversion structure may further contain a second material deeper in lowest unoccupied molecular orbital level than the first material or a third material shallower in highest occupied molecular orbital level than the first material.

The configuration according to Item 12 allows reduction in a probability of a charge pair generated through photoelectric conversion recombining together to disappear before arriving at the avalanche structure.

In the present disclosure, all or a part of any of circuit, unit, device, part, or portion, or all or a part of functional blocks in the block diagrams may be implemented as one or more of electronic circuits including, but not limited to, a semiconductor device, a semiconductor integrated circuit (IC), or a large scale integration (LSI). The LSI or IC can be integrated into one chip, or also can be a combination of plural chips. For example, functional blocks other than a memory may be integrated into one chip. The name used here is LSI or IC, but it may also be called system LSI, very large scale integration (VLSI), or ultra large scale integration (ULSI) depending on the degree of integration. A field programmable gate array (FPGA) that can be programmed after manufacturing an LSI or a reconfigurable logic device that allows reconfiguration of the connection or setup of circuit cells inside the LSI can be used for the same purpose.

Further, it is also possible that all or a part of the functions or operations of the circuit, unit, device, part, or portion are implemented by executing software. In such a case, the software is recorded on one or more non-transitory recording media such as a ROM, an optical disk, or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

First Embodiment

Embodiments of the present disclosure will be described below in detail with reference to the drawings. The embodiments described below are comprehensive or specific examples. Numerical values, shapes, materials, constituent elements, the arrangement and connection forms of the constituent elements, steps, the order of the steps, and the like illustrated in the embodiments below are merely illustrative, and are not intended to limit the present disclosure. Various aspects described in the present specification can be combined as long as there is no contradiction. Among the constituent elements in the embodiments below, those not described in an independent claim representing a top-level concept will be described as optional constituent elements. In the description below, constituent elements having substantially the same functions are denoted by the same reference characters, and a description thereof may be omitted.

FIG. 1 shows an exemplary device structure of a photodetection element according to a first embodiment of the present disclosure. Note that FIG. 1 merely schematically illustrates the layout of components constituting the photodetection element and that sizes of the components shown in FIG. 1 do not always exactly reflect sizes in an actual device. The same applies to the other drawings in the present disclosure.

A photodetection element 100A shown in FIG. 1 schematically includes a photoelectric conversion structure 110 and an avalanche structure 120. In the example, the photoelectric conversion structure 110 is arranged in contact with the avalanche structure 120. As shown in FIG. 1, the photodetection element 100A can further include a first electrode 130A and a second electrode 140.

The avalanche structure 120 is a structure including a monocrystalline silicon layer in which avalanche multiplication occurs as a result of injection of charges from the photoelectric conversion structure 110. In the example shown in FIG. 1, the avalanche structure 120 has a configuration similar to that of a PIN-type silicon avalanche photodiode.

Figure 13:
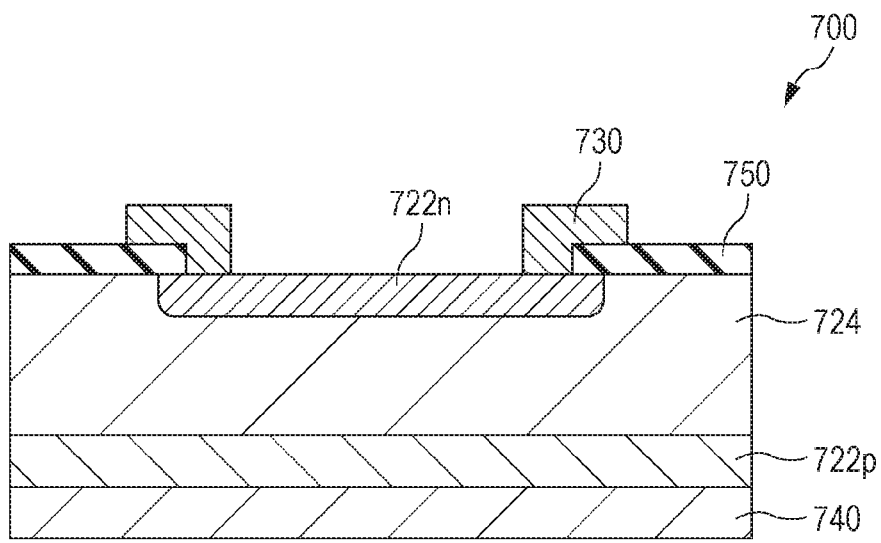
FIG. 13 is a schematic cross-sectional view showing a device structure of a common PIN-type silicon avalanche photodiode.

FIG. 13 shows, for reference, a device structure of a common PIN-type silicon avalanche photodiode. The PIN-type avalanche photodiode 700 shown in FIG. 13 includes a cathode 730, a heavily doped N-type region 722n, a lightly doped region 724, a heavily doped P-type region 722p, and an anode 740. As schematically shown in FIG. 13, the heavily doped N-type region 722n is located in the vicinity of a surface of the lightly doped region 724, and the cathode 730 is electrically connected to a part of the heavily doped N-type region 722n. The heavily doped P-type region 722p is located on the opposite side of the lightly doped region 724 from the heavily doped N-type region 722n, and the anode 740 is electrically connected to the heavily doped P-type region 722p. The PIN-type avalanche photodiode 700 shown in FIG. 13 further includes an insulating layer 750, a part of which is located between the cathode 730 and the heavily doped N-type region 722n. The insulating layer 750 is provided to improve a withstand voltage.

Referring back to FIG. 1, in the configuration illustrated in FIG. 1, the avalanche structure 120 includes a heavily doped N-type region 122n, a lightly doped region 124, and a heavily doped P-type region 122p. The heavily doped N-type region 122n, the lightly doped region 124, and the heavily doped P-type region 122p can be regions in a silicon substrate which are different in impurity concentration or dopant from each other. Here, the heavily doped N-type region 122n, the lightly doped region 124, and the heavily doped P-type region 122p in the avalanche structure 120 are arranged in this order in a direction from the second electrode 140 toward the first electrode 130A. Note that the conductivity types of the doped regions are not limited to those in the example shown in FIG. 1. A configuration in which the N-type and P-type regions have exchanged conductivity types with each other is also possible.

The photoelectric conversion structure 110 has a function of absorbing a photon of a wavelength, to which the photodetection element 100A is desired to have sensitivity, and generating a charge. Note that the avalanche structure 120 includes a monocrystalline silicon layer and that a semiconductor typified by monocrystalline silicon basically has a photoelectric conversion function regardless of whether the level of the function is high or low. For this reason, the avalanche structure 120 can generate a charge inside as a result of irradiation with light, like the photoelectric conversion structure 110. The photoelectric conversion structure 110 according to the present disclosure is distinguishable from the avalanche structure 120 in that the photoelectric conversion structure 110 contains a first material having an absorption coefficient higher than that of monocrystalline silicon for light of a certain wavelength included in a wavelength range, for which monocrystalline silicon exhibits absorption.

The first material includes at least one selected from the group consisting of an organic semiconductor, a semiconductor-type carbon nanotube, and a semiconductor quantum dot. An example of an organic semiconductor which has an absorption coefficient higher than that of monocrystalline silicon for light of a certain wavelength included in the wavelength range, for which monocrystalline silicon exhibits absorption, is poly(3-hexylthiophene) (P3HT). P3HT exhibits an absorption coefficient higher than that of monocrystalline silicon for a wavelength range of about 450 nm to 600 nm. For each of many phthalocyanines and naphthalocyanines, a wavelength, for which the phthalocyanine or naphthalocyanine exhibits an absorption coefficient higher than that of monocrystalline silicon, is present within a wavelength range, for which monocrystalline silicon exhibits absorption.

A semiconductor-type carbon nanotube has flexibility called chirality, exhibits resonance absorption for a different wavelength depending on the chirality, and exhibits an absorption coefficient higher than that of monocrystalline silicon for the resonant wavelength. For example, a semiconductor-type carbon nanotube having a chiral index of (9,8) exhibits resonance absorption for wavelengths around 800 nm and around 1.45 μm. A semiconductor-type carbon nanotube having a chiral index of (7,6) exhibits resonance absorption for wavelengths around 640 nm and around 1.15 µm. Thus, a photodetection element having peculiarly high sensitivity to a specific wavelength can be created by, for example, forming the photoelectric conversion structure 110 using a single-walled carbon nanotube having chirality appropriate for a wavelength of light targeted for detection.

As can be seen from the above-described examples, a semiconductor-type carbon nanotube can have an absorption edge at a wavelength longer than 1.1 µm that is an absorption edge of monocrystalline silicon. Thus, a photoelectric conversion structure which can generate charges through photoelectric conversion as a result of reception of light of a wavelength above a wavelength range, for which monocrystalline silicon exhibits absorption, can be created by, for example, adopting, as the first material, a single-walled carbon nanotube having chirality that exhibits resonance absorption for a side longer in wavelength than the absorption edge of monocrystalline silicon. In other words, a photodetection element having sensitivity to light of a wavelength above the wavelength range, for which monocrystalline silicon exhibits absorption, such as near-infrared light, can be created. Note that electromagnetic waves in general including infrared light (of a wavelength longer than 780 nm) and ultraviolet light (of a wavelength shorter than 380 nm) are expressed as light in the present specification for the sake of convenience. In the present specification, the term "absorption edge" is also used for light other than X-rays.

The first material need not be a single material and may include a plurality of materials. For example, sensitivity to each of a plurality of wavelength ranges can be given to a photodetection element by making a plurality of types of semiconductor-type carbon nanotubes different in chirality coresident inside the photoelectric conversion structure 110. It is also possible to create a photodetection element having high sensitivity to both a visible region and an infrared region by making an organic semiconductor having a high absorption coefficient for the visible region and a semiconductor-type carbon nanotube which exhibits resonance absorption for the infrared region coresident inside the photoelectric conversion structure 110.

The photoelectric conversion structure 110 may further contain a second material having a lowest unoccupied molecular orbital (LUMO) level deeper than that of the first material or a third material having a highest occupied molecular orbital (HOMO) level shallower than that of the first material. In a photoelectric conversion structure composed of an organic semiconductor and/or a semiconductor-type carbon nanotube, even if a pair of positive and negative charges is generated inside through photoelectric conversion, the charges can recombine together to disappear in a relatively short time. When charges generated as a result of photon incidence recombine together to disappear before transfer to the avalanche structure 120, an electron avalanche in the avalanche structure 120 does not occur, and the photon incidence is not detected. Further inclusion of the second material or the third material in a material for forming the photoelectric conversion structure 110 in addition to the first material allows reduction in the probability of charges generated through photoelectric conversion recombining together to disappear before arrival at the avalanche structure 120.

If the photoelectric conversion structure 110 further contains the second material deeper in LUMO level than the first material, a negative one of positive and negative charges generated through photoelectric conversion shifts to the LUMO level of the second material. If the photoelectric conversion structure 110 further contains the third material shallower in HOMO level than the first material, a positive one of positive and negative charges generated through photoelectric conversion shifts to the HOMO level of the third material. That is, use of the second material or the third material in addition to the first material allows efficient drawing of, for example, an electron or a hole from a semiconductor-type carbon nanotube and the like and reduction in the probability of a charge pair recombining together to disappear before arrival at the avalanche structure 120. In other words, it is possible to separate positive and negative charges generated through photoelectric conversion, reduce a recombination probability, and improve photon detection efficiency.

Examples of the second material are fullerenes, such as $C_{60}$, fullerene derivatives, such as phenyl-$C_{61}$-butyric acid methyl ester (PCBM), and N-type organic semiconductor polymers, such as Activink® (a registered trademark in the U.S.) N2200 from Polyera Corporation. An example of the third material is poly(3-hexylthiophene) (P3HT).

The photoelectric conversion structure 110 may contain any other material in addition to the first, second, and third materials described above. A polymer or a low-molecular-weight compound which inhibits agglomeration of semiconductor-type carbon nanotubes when each semiconductor-type carbon nanotube is coated may be further mixed into the material for forming the photoelectric conversion structure 110. An example of the polymer, with which a semiconductor-type carbon nanotube is coated, is poly[2-methoxy-5-(3',7'-dimethyloctyloxy)-1,4-phenylenevinylene] (MDMO-PPV). Note that P3HT or N2200 described above can also function as the polymer, with which a semiconductor-type carbon nanotube is coated. Examples of the low-molecular-weight compound, with which a semiconductor-type carbon nanotube is coated, are sodium cholate and sodium lauryl sulfate.

The photoelectric conversion structure 110 may contain a colloidal quantum dot which is a semiconductor quantum dot. The colloidal quantum dot is a structure which has a core of a size about several to several tens of nanometers and composed of a crystalline semiconductor, and the core is surrounded by another material. The colloidal quantum dot has the property of dispersing in a solvent and can be applied to another semiconductor or a metal at about a room temperature. Even after application, the crystalline semiconductor core has the property of generating charges as a result of light absorption, like a common crystalline semiconductor.

Details of a colloidal quantum dot are described in, for example, Joel Q. Grim, Liberato Manna, and Iwan Moreels, "A sustainable future for photonic colloidal nanocrystals", Chemical Society Review, 2015, Vol. 44, pp. 5897-5914 issued by The Royal Society of Chemistry.

A core of a colloidal quantum dot can be made from various semiconductor materials. A colloidal quantum dot having, for example, lead sulfide (PbS) or lead selenide (PbSe) as a core exhibits significant absorption for a wavelength longer than 1.1 µm and generates charges. For this reason, if such a colloidal quantum dot is used in the photoelectric conversion structure 110, a photodetection element having sensitivity to a wavelength longer than 1.1 µm that is the absorption edge of monocrystalline silicon can be created.

A colloidal quantum dot having cadmium selenide (CdSe), cadmium telluride (CdTe), or the like as a crystalline semiconductor core exhibits an absorption coefficient higher than that of monocrystalline silicon for the visible region.

For this reason, a photodetection element having higher sensitivity to the visible region can be created.

In the configuration illustrated in FIG. 1, the photodetection element 100A further includes the first electrode 130A electrically connected to the photoelectric conversion structure 110 and the second electrode 140 electrically connected to the heavily doped N-type region 122n. The first electrode 130A and the second electrode 140 are elements for achieving electrical connection with an element, such as a power source or a signal detection circuit. In the example shown in FIG. 1, the avalanche structure 120 is located between the first electrode 130A and the second electrode 140. The first electrode 130A and the second electrode 140 apply a voltage for producing a high internal electric field sufficient to achieve a charge multiplying function to the avalanche structure 120.

In the configuration illustrated in FIG. 1, the first electrode 130A is arranged on a principal surface on the opposite side of the photoelectric conversion structure 110 from a principal surface, on which the avalanche structure 120 is arranged. The second electrode 140 is arranged on a principal surface on the opposite side of the avalanche structure 120 from a principal surface, on which the photoelectric conversion structure 110 is arranged. Light targeted for detection is applied, for example, from a side with the first electrode 130A located closer to the photoelectric conversion structure 110 than the second electrode 140. If an absorption edge of the first material is located on a side longer in wavelength than the absorption edge of monocrystalline silicon, since a part of applied light can pass through the avalanche structure 120 and arrive at the photoelectric conversion structure 110, light may be applied from a side with the second electrode 140. A filter which selectively transmits infrared light or any other component can be arranged on a side of the photodetection element 100A, to which light is applied, as needed.

As shown in FIG. 1, if the first electrode 130A covers a whole surface of the photoelectric conversion structure 110, a material which has the property of transmitting at least light of a wavelength targeted for detection is selected as a constituent material for the first electrode 130A. The first electrode 130A is formed from, for example, a transparent conductive oxide (TOO), such as indium tin oxide (ITO). Note that the term "transparent" in the present specification means transmitting at least a part of light within a wavelength range targeted for detection and that transmitting light over a whole wavelength range for visible light is not required.

Use of a material which has a high degree of electrical conductivity and is intrinsically light-absorptive, such as gold or graphene, as the material for forming the first electrode 130A is also possible. If such a material is used, the first electrode 130A may be thinned to an extent which transmits light of a wavelength targeted for detection.

The same material as that for the first electrode 130A can be used as a material for forming the second electrode 140. Note that the material for forming the first electrode 130A and the material for forming the second electrode 140 need not be the same. As can be seen from the above description, the term "electrode" in the present specification is not limited to a metal electrode and is interpreted to cover a wide range of structures formed from a conductive material, such as a transparent conductive oxide, a metal-semiconductor compound like silicide, or a heavily doped polycrystalline semiconductor. For example, in a structure in which the photodetection elements 100A are integrated on a single semiconductor substrate, a high-concentration impurity region in the semiconductor substrate can function as the first electrode 130A and/or the second electrode 140.

In the embodiment of the present disclosure, the photoelectric conversion structure 110 primarily bears the function of generating charges through photoelectric conversion, and the avalanche structure 120 bears the function of multiplying charges generated by the photoelectric conversion structure 110. The avalanche structure 120 includes a monocrystalline silicon layer as a structure which causes avalanche multiplication inside, and multiplication of charges generated by the photoelectric conversion structure 110 occurs basically inside the monocrystalline silicon layer. Trap density is known to differ between materials. Monocrystalline silicon is lower in trap density than polycrystalline silicon or amorphous silicon and is lower in trap density than a compound semiconductor, such as InGaAs. It is thus possible to inhibit charges from being trapped in the avalanche structure 120 and inhibit an afterimage and an afterpulse from being generated by causing avalanche multiplication in the monocrystalline silicon layer of the avalanche structure 120.

According to the embodiment of the present disclosure, some or all of functions of the avalanche structure 120 are implemented by the monocrystalline silicon layer. For example, it is relatively easy to integrate a plurality of photodetection elements 100A on a single silicon substrate. That is, a high-sensitivity image sensor having a charge multiplying function can be created using a single silicon substrate. It is also relatively easy to further form a transistor on a silicon substrate, on which pixels including respective avalanche structures 120 are formed. Thus, peripheral circuits, such as a quenching circuit (to be described later), can be integrated on the same silicon substrate.

Additionally, in the embodiment of the present disclosure, the photoelectric conversion structure 110 is made from a material containing the first material different from monocrystalline silicon. As described above, a material having an absorption coefficient higher than that of monocrystalline silicon for light of a certain wavelength included in a wavelength range, for which monocrystalline silicon exhibits absorption, is selected as the first material. Thus, higher sensitivity to light of the wavelength is achieved than in a case where the photoelectric conversion structure 110 is formed from monocrystalline silicon. To achieve equivalent sensitivity to light of the wavelength, the size of the photoelectric conversion structure 110 can be made smaller than in the case where the photoelectric conversion structure 110 is formed from monocrystalline silicon. This is beneficial to integration.

Use of a material having an absorption edge on a side longer in wavelength than 1.1 μm that is the absorption edge of monocrystalline silicon as the first material allows the photodetection element 100A to have substantial sensitivity to light having a wavelength longer than the absorption edge of monocrystalline silicon that is determined by a band gap. As is well known, monocrystalline silicon is an indirect transition semiconductor and has a small absorption coefficient especially for light in a near-infrared region. For this reason, if the photoelectric conversion structure 110 is formed from monocrystalline silicon, the area or the thickness of the photoelectric conversion structure 110 needs to be increased to give sufficient sensitivity to the near-infrared region, which is not beneficial to integration of a plurality of photodetection elements 100A. According to the embodiment of the present disclosure, it is possible to achieve sufficient sensitivity to light in the near-infrared region while keeping dimensions of the photoelectric conversion structure 110 small.

Note that it is also possible to give sensitivity to the near-infrared region or give sensitivity to light of a wavelength not less than 1.1 µm by forming the photoelectric conversion structure 110 from a compound semiconductor. The compound semiconductor, however, has a high trap density and may suffer from reduction in S/N ratio due to an afterimage or an afterpulse. Especially if the compound semiconductor is polycrystalline, the trap density may increase. For this reason, although the compound semiconductor is desirably monocrystalline, it is generally difficult to cause monocrystals of a compound semiconductor, such as InGaAs, to grow on monocrystalline silicon. Like the technology described in Z. Huang et al., "25 Gbps low-voltage waveguide Si—Ge avalanche photodiode", Optica, July 2016, Vol. 3, No. 8, pp. 793-798, although a layer of monocrystalline germanium can be formed on monocrystalline silicon, a thickness which maintains good crystallinity is limited to about several atomic layers due to a difference in lattice constant, and securement of a thickness sufficient for light absorption is difficult.

In the embodiment of the present disclosure, a material including at least one selected from the group consisting of an organic semiconductor, a semiconductor-type carbon nanotube, and a semiconductor quantum dot is used as the first material. As for each of the organic semiconductor, the semiconductor-type carbon nanotube, and the semiconductor quantum dot, an individual molecule or particle exhibits properties of a semiconductor. That is, an individual molecule or particle can be said to have the function of absorbing a photon and generating a charge pair. As will be described later, according to the embodiment of the present disclosure, the photoelectric conversion structure 110 can be obtained by depositing or applying a material containing the first material on the avalanche structure 120 without the need for a process, such as epitaxial growth. Although crystals are inseparable from defect generation, the photoelectric conversion structure 110 can be obtained by the deposition or application. This is beneficial to reduction in trap.

According to the embodiment of the present disclosure, since there is no need for consideration of lattice matching conditions, there is less restriction on materials, and flexibility in designing a wavelength of light targeted for detection is higher, as compared with a case where the photoelectric conversion structure 110 is constructed using an inorganic monocrystalline semiconductor, such as monocrystalline germanium or monocrystalline silicon-germanium. Additionally, since formation of the photoelectric conversion structure 110 on the monocrystalline silicon layer constituting a part or a whole of the avalanche structure 120 is easy, creation of an image sensor through integration of a plurality of photodetection elements is relatively easy.

(Operation by Photodetection Element 100A)

An overview of light detection operation by the photodetection element 100A will be described below. The photodetection element 100A is capable of light detection with reduced noise in either linear mode or Geiger mode and is particularly suitable for operation in linear mode. In linear mode, light detection is executed under a reverse bias close to and below a breakdown voltage. In linear mode, an output which is proportional to the number of incident photons and is amplified by a fixed multiplication factor is obtained. Thus, a photodetection element according to the present disclosure can be used as a higher-sensitivity device for the same purpose as that for a silicon photodiode. Operation in linear mode will be described below.

At the time of light detection, a power source (not shown) is connected to the first electrode 130A and the second electrode 140, and a potential difference is applied between the first electrode 130A and the second electrode 140 such that a potential on the second electrode 140 side is higher than a potential on the first electrode 130A side. In other words, the photodetection element 100A is put into a state in which a reverse bias is applied to the avalanche structure 120. The magnitude of the reverse bias applied at this time is smaller than that of a potential difference which causes avalanche breakdown.

For example, if light is applied from the first electrode 130A side, and the light enters the photoelectric conversion structure 110, an organic semiconductor, a semiconductor-type carbon nanotube, or a semiconductor quantum dot in the photoelectric conversion structure 110 absorbs light, which causes generation of, for example, a hole-electron pair in a molecule or a particle. In the configuration illustrated in FIG. 1, the photoelectric conversion structure 110 is located between the first electrode 130A and the second electrode 140, and a potential difference is provided here from the power source to between the first electrode 130A and the second electrode 140. For this reason, a force due to an electric field between the first electrode 130A and the second electrode 140 acts on the hole and the electron generated through photoelectric conversion, and the hole and the electron transfer toward the first electrode 130A and the second electrode 140, respectively.

In the first embodiment, the first electrode 130A, the second electrode 140, the photoelectric conversion structure 110, and the avalanche structure 120 are arranged in a linear manner, and the avalanche structure 120 is located between the photoelectric conversion structure 110 and the second electrode 140 or between the photoelectric conversion structure 110 and the first electrode 130A. Thus, one of the hole and the electron generated through the photoelectric conversion passes through the avalanche structure 120 before the one arrives at the first electrode 130A or the second electrode 140.

Of the hole and the electron generated through the photoelectric conversion, a charge after transfer from the photoelectric conversion structure 110 into the avalanche structure 120 is accelerated by an electric field inside the avalanche structure 120 to cause an electron avalanche, and a macroscopic current is output from the photodetection element 100A. Note that a charge generated through photoelectric conversion inside the avalanche structure 120 can also be accelerated by the electric field inside the avalanche structure 120 to cause an electron avalanche. In linear mode, charges, the number of which is the product of the number of charges generated through light application and a multiplication constant for an avalanche effect, are output. A gain at this time exhibits a magnitude corresponding to a reverse bias, and signal strength corresponding to illuminance is obtained as a result of light application. For example, at the time of light detection by applying a reverse bias close to the breakdown voltage, a gain of about several hundreds of times can be obtained. Note that, if the photodetection element 100A is brought into operation in Geiger mode, a charge transfers from the photoelectric conversion structure 110 into the avalanche structure 120, which causes a transition to a state in which a breakdown current flows.

(Overview of Method for Manufacturing Photodetection Element 100A)

The photodetection element 100A described above can be manufactured, for example, by the following procedure.

A heavily doped N-type monocrystalline silicon substrate is first prepared. Chemical vapor deposition (CVD) or molecular beam epitaxy (MBE) is used to sequentially form the lightly doped region 124 and the heavily doped P-type region 122p on the N-type monocrystalline silicon substrate through epitaxial growth. With the formation of the lightly doped region 124 and the heavily doped P-type region 122p, the avalanche structure 120 is obtained. At least a part of the N-type monocrystalline silicon substrate functions as the heavily doped N-type region 122n of the avalanche structure 120. Note that the avalanche structure 120 may be obtained by using ion implantation or impurity diffusion to form the heavily doped N-type region 122n, the lightly doped region 124, and the heavily doped P-type region 122p on the monocrystalline silicon substrate. After that, the second electrode 140 is formed on the heavily doped N-type region 122n side of the avalanche structure 120, as needed.

The photoelectric conversion structure 110 is then formed on the avalanche structure 120. The photoelectric conversion structure 110 is formed here on the heavily doped P-type region 122p side of the avalanche structure 120. The formation of the photoelectric conversion structure 110 can be executed by depositing or applying a material containing the first material on the avalanche structure 120. Molecules of relatively low molecular weight (for example, organic semiconductors, such as phthalocyanines and naphthalocyanines, and $C_{60}$ that can be used as the second material) exhibit a sublimation property and can be evaporated in a vacuum. Organic semiconductor materials, such as P3HT and PCBM that can be used as the second material, are soluble in an organic solvent and can be added onto the avalanche structure 120 using spin coating, a doctor blade, an inkjet system, or the like after being dispersed into an organic solvent. After the addition onto the avalanche structure 120, the photoelectric conversion structure 110 can be formed by vaporizing the organic solvent. A semiconductor-type carbon nanotube can be applied on the avalanche structure 120 by dispersing the semiconductor-type carbon nanotube into an organic solvent, such as 1-methyl-2-pyrrolidone (NMP) or dichlorobenzene. Alternatively, the semiconductor-type carbon nanotube may be applied and dried after the property of dispersing in an organic solvent is improved by coating the semiconductor-type carbon nanotube with a polymer, such as N2200 or MDMO-PPV. A colloidal quantum dot can disperse in a solvent, such as toluene, and can be applied on the avalanche structure 120.

A semiconductor-type carbon nanotube can be synthesized by CVD, arc discharge, or the like. Note that, as for carbon nanotube manufacture, not only a semiconductor-type carbon nanotube but also a metal-type carbon nanotube is commonly produced. Since a metal-type carbon nanotube can act as a recombination center for a charge pair, the sensitivity of the photodetection element 100A can be improved by separating semiconductor-type carbon nanotubes and metal-type carbon nanotubes and increasing the ratio of semiconductor-type carbon nanotubes.

A colloidal quantum dot can be produced by a flocculation method using a supersaturated solution or the like, a dispersion method that physically breaking down particles into smaller particles, or the like.

A process for formation of the photoelectric conversion structure 110 need not be a single process and may be a combination of a plurality of processes. For example, a process of evaporating $C_{60}$ may be further executed after a process of adding a semiconductor-type carbon nanotube on the avalanche structure 120 by spin coating.

After the formation of the photoelectric conversion structure 110, the first electrode 130A is formed on the photoelectric conversion structure 110. For example, if ITO is used as the material for the first electrode 130A, the first electrode 130A can be formed by sputtering or the like. If a metal, such as gold, is used as the material for the first electrode 130A, the first electrode 130A can be formed by evaporation or the like. With the formation of the first electrode 130A, the photodetection element 100A shown in FIG. 1 is obtained.

(Modification)

The configuration shown in FIG. 1 is merely illustrative and may be variously altered. A photodetection element may further include an additional element other than the photoelectric conversion structure 110, the avalanche structure 120, the first electrode 130A, and the second electrode 140. For example, an insulating layer may be arranged between the photoelectric conversion structure 110 and the avalanche structure 120 as long as charge transfer from the photoelectric conversion structure 110 to the avalanche structure 120 is possible. The insulating layer may be thin enough for charges to transfer from the photoelectric conversion structure 110 to the avalanche structure 120 due to a tunnel effect, for example, as thin as about several nanometers. An insulating layer may also be arranged between the avalanche structure 120 and an electrode. A blocking layer which inhibits charges from being injected from the first electrode 130A into the photoelectric conversion structure 110 may be arranged between the photoelectric conversion structure 110 and the first electrode 130A. A photodetection element may further include a bonding layer or the like for more firmly bonding elements constituting components.

The avalanche structure 120 only needs to include a monocrystalline silicon layer which is capable of charge multiplication and includes a plurality of regions different in impurity concentration, and a specific configuration thereof is not limited to the configuration illustrated in FIG. 1. The avalanche structure 120 may have, for example, a configuration similar to that of a common reach-through-type silicon avalanche photodiode.

Figure 14:
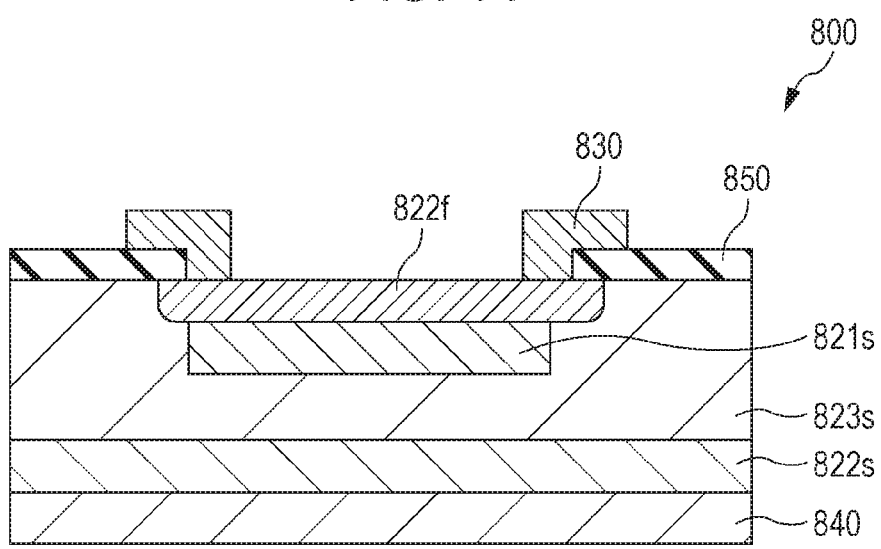
FIG. 14 is a schematic cross-sectional view showing a device structure of a common reach-through-type silicon avalanche photodiode.

FIG. 14 shows, for reference, a device structure of a common reach-through-type silicon avalanche photodiode. The reach-through-type avalanche photodiode 800 shown in FIG. 14 includes electrodes 830 and 840, a heavily doped region 822f of a first conductivity type, a moderately doped region 821s of a second conductivity type which has intermediate impurity concentration, a lightly doped region 823s of the second conductivity type, and a heavily doped region 822s of the second conductivity type. In the example, the reach-through-type avalanche photodiode 800 further includes an insulating layer 850, a part of which is located between the electrode 830 and the heavily doped region 822f. The heavily doped region 822f is located in the vicinity of a surface of the lightly doped region 823s, and the moderately doped region 821s is adjacent to the heavily doped region 822f inside the lightly doped region 823s. If the first conductivity type and the second conductivity type are N-type and P-type, respectively, the electrode 830 connected to the heavily doped region 822f functions as a cathode while the electrode 840 connected to the heavily doped region 822s functions as an anode. If the first conductivity type and the second conductivity type are P-type and N-type, respectively, the roles of the electrodes 830 and 840 are reversed, and the electrode 830 functions as an anode while the electrode 840 functions as a cathode. The avalanche structure 120 may have a configuration similar to that of a reverse-type silicon avalanche photodiode.

Arrangement of the photoelectric conversion structure 110 with respect to the avalanche structure 120 is not limited to the example shown in FIG. 1. The photoelectric conversion structure 110 may be arranged closer to the first electrode 130A than the avalanche structure 120, as shown in FIG. 1, or arranged closer to the second electrode 140 than the avalanche structure 120. Alternatively, the photoelectric conversion structure 110 may be arranged inside the avalanche structure 120.

The first electrode 130A is not required to cover a whole surface of the photoelectric conversion structure 110 and may have an opening. A transparent member which can transmit at least light of a wavelength targeted for detection may be arranged inside the opening provided in the first electrode 130A. Such a transparent member can be formed using an insulative material, such as an aluminum oxide or a silicon oxide.

Second Embodiment

Figure 2:
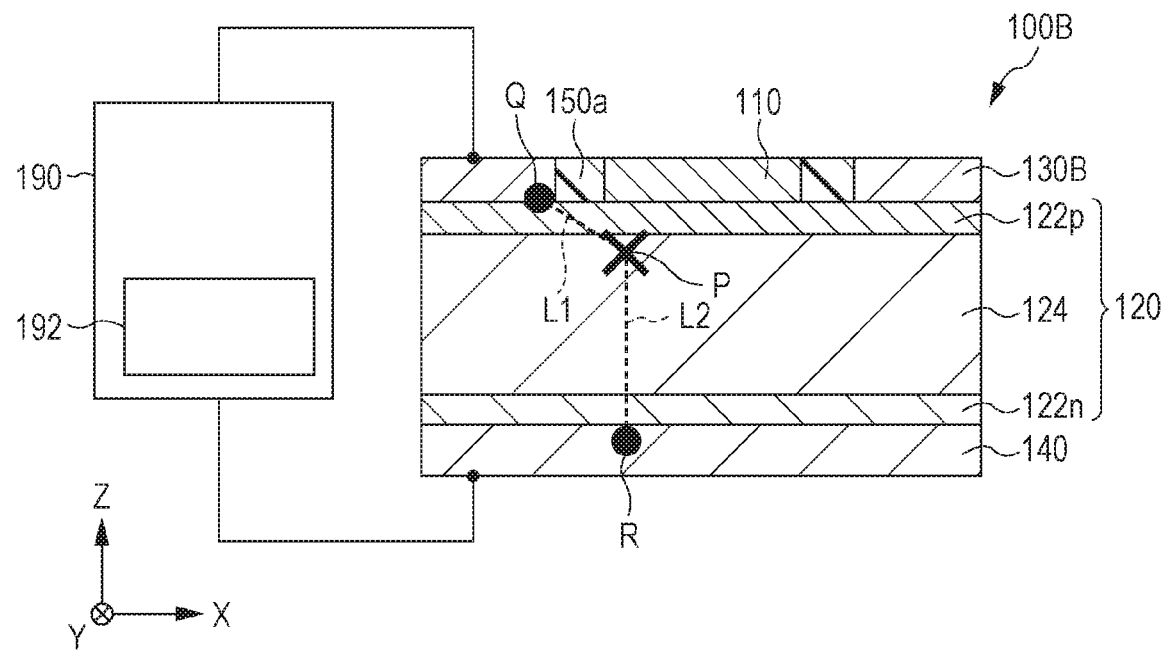
FIG. 2 is a view showing an exemplary device structure of a photodetection element according to a second embodiment.

FIG. 2 shows an exemplary device structure of a photodetection element according to a second embodiment of the present disclosure. Arrows indicating an X direction, a Y direction, and a Z direction orthogonal to one another are shown together in FIG. 2 for reference. The photodetection element according to the second embodiment of the present disclosure is capable of reducing an afterpulse more effectively than in the first embodiment and is more beneficial to operation in Geiger mode.

A main difference between a photodetection element 100B shown in FIG. 2 and the photodetection element 100A described with reference to FIG. 1 is that the photodetection element 100B includes a first electrode 130B instead of the first electrode 130A that covers a photoelectric conversion structure 110. As schematically shown in FIG. 2, the first electrode 130B and the photoelectric conversion structure 110 do not have portions in direct contact with each other.

In the example shown in FIG. 2, the first electrode 130B is arranged on an avalanche structure 120 so as to be spaced from the photoelectric conversion structure 110. A dielectric region 150a intervenes between the photoelectric conversion structure 110 and the first electrode 130B. The dielectric region 150a can be made from, for example, an insulative inorganic material (for example, a silicon oxide or a silicon nitride, with which a gap between the first electrode 130B and the photoelectric conversion structure 110 is filled) or an insulative organic material (for example, an amorphous fluororesin). An example of the amorphous fluororesin is CYTOP® from Asahi Glass Co., Ltd. The dielectric region 150a may be an air layer or a region which is evacuated and is in the near vacuum. As will be described later, since the photoelectric conversion structure 110 is not located between the first electrode 130B and a second electrode 140 in the second embodiment, current does not flow to the photoelectric conversion structure 110 even in an avalanche breakdown state, and charges can be prevented from being trapped in the photoelectric conversion structure 110. As a result, an afterpulse can be reduced.

Figure 3:
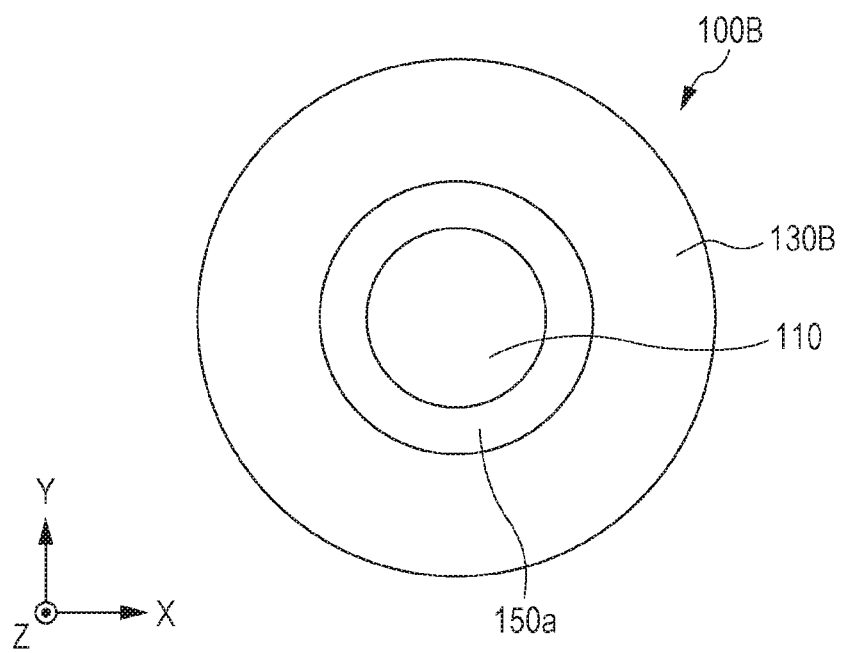
FIG. 3 is a plan view showing an example of an outer appearance when the photodetection element shown in FIG. 2 is viewed along a Z axis.

FIG. 3 shows an example of an outer appearance when the photodetection element 100B shown in FIG. 2 is viewed along a Z axis. Like FIG. 2, arrows indicating the X direction, the Y direction, and the Z direction are shown together in FIG. 3. In the configuration illustrated in FIG. 3, the first electrode 130B has a ring shape. The photoelectric conversion structure 110 is located inside an opening of the ring shape of the first electrode 130B. Planar shapes of the first electrode 130B and the photoelectric conversion structure 110 are not limited to the shapes shown in FIG. 3. For example, an outer shape of the first electrode 130B is not limited to a circular shape as illustrated in FIG. 3 and may be any other shape, such as an elliptical shape, a rectangular shape, a polygonal shape, or an indefinite shape. The outer shape of the first electrode 130B need not coincide with a shape of the opening provided at the center of the first electrode 130B, and the ring shape need not be closed. For example, the first electrode 130B may have a C shape obtained by notching a ring shape or the first electrode 130B may include a plurality of portions which are dispersedly arranged around the photoelectric conversion structure 110. The planar shape of the photoelectric conversion structure 110 may be arbitrarily set, and an outer shape of the photoelectric conversion structure 110 need not coincide with the outer shape of the first electrode 130B. It is beneficial that the photoelectric conversion structure 110 and the first electrode 130B have planar shapes having high symmetry, as shown in FIG. 3. It is beneficial in a case where a plurality of photodetection elements 100B are arranged in an array that the photoelectric conversion structure 110 and the first electrode 130B have polygonal shapes, such as triangular shapes, rectangular shapes, or hexagonal shapes.

The arrangement of the photoelectric conversion structure 110, the first electrode 130B, and the second electrode 140 will be described below in more detail with reference to FIG. 2. In the configuration illustrated in FIG. 2, the photoelectric conversion structure 110 is not located between the first electrode 130B and the second electrode 140. Assume here that an arbitrary point P is set inside the avalanche structure 120 and that a first straight line L1 which connects the point P and a point Q located inside the first electrode 130B and closest to the point P is drawn, as schematically shown in FIG. 2. Also, assume that a second straight line L2 which connects the point P and a point R located inside the second electrode 140 and closest to the point P is drawn. In this case, the photoelectric conversion structure 110 is arranged so as to be located neither on the first straight line L1 nor on the second straight line L2.

As will be described later in detail, the second embodiment is the same as the first embodiment in that a reverse bias is applied between the first electrode 130B and the second electrode 140 at the time of light detection. Thus, a charge after transfer from the photoelectric conversion structure 110 to the avalanche structure 120 is accelerated in accordance with an internal electric field formed between the first electrode 130B and the second electrode 140 as a result of the application of the reverse bias and transfers toward the first electrode 130B or the second electrode 140. Note here that since the photoelectric conversion structure 110 is arranged so as to be located neither on the first straight line L1 nor on the second straight line L2, neither a transfer pathway for a charge which is to trigger an electron avalanche nor a transfer pathway for a charge generated by an electron avalanche crosses the photoelectric conversion structure 110. That is, charges passing through the photoelectric conversion structure 110 can be reduced, and the probability of charges being trapped in the photoelectric conversion structure 110 can be reduced. It is thus possible to more effectively inhibit generation of an afterpulse, for example, during operation in Geiger mode.

In light detection in Geiger mode, a reverse bias above a breakdown voltage is applied to the avalanche structure 120, like a common silicon avalanche photodiode. FIG. 2 shows a state in which a voltage supply circuit 190 is connected between the first electrode 130B and the second electrode 140. The voltage supply circuit 190 applies a reverse bias above the breakdown voltage to the photodetection element 100B at the time of light detection. The voltage supply circuit 190 typically includes a power source which supplies a reverse bias above the breakdown voltage. The voltage supply circuit 190 is not limited to a particular power circuit and may be a circuit which generates a predetermined voltage or a circuit which converts an input voltage into a predetermined voltage.

The voltage supply circuit 190 typically further includes a quenching circuit 192 which is configured to be capable of applying a voltage below the breakdown voltage to the avalanche structure 120. Either a passive mechanism or an active mechanism can be used as the quenching circuit 192. For example, a quenching resistor may be used as the passive mechanism. The quenching resistor is connected in series to the first electrode 130B or the second electrode 140. The quenching circuit 192 may be an active mechanism including an active element, such as a transistor. For example, Japanese Unexamined Patent Application Publication No. 2012-069944 discloses an example of the active mechanism. The disclosure of Japanese Unexamined Patent Application Publication No. 2012-069944 is incorporated by reference herein in its entirety. The quenching circuit 192 can include, in its part, a detection circuit which detects a current due to avalanche breakdown. The quenching circuit 192 may be a part of the photodetection element 100B.

(Operation by Photodetection Element 100B)

An overview of light detection operation by the photodetection element 100B will be described below with reference to FIGS. 2 and 4. The photodetection element 100B is operable either in linear mode or in Geiger mode and is particularly suitable for operation in Geiger mode. Operation in Geiger mode will be described below.

Figure 4:
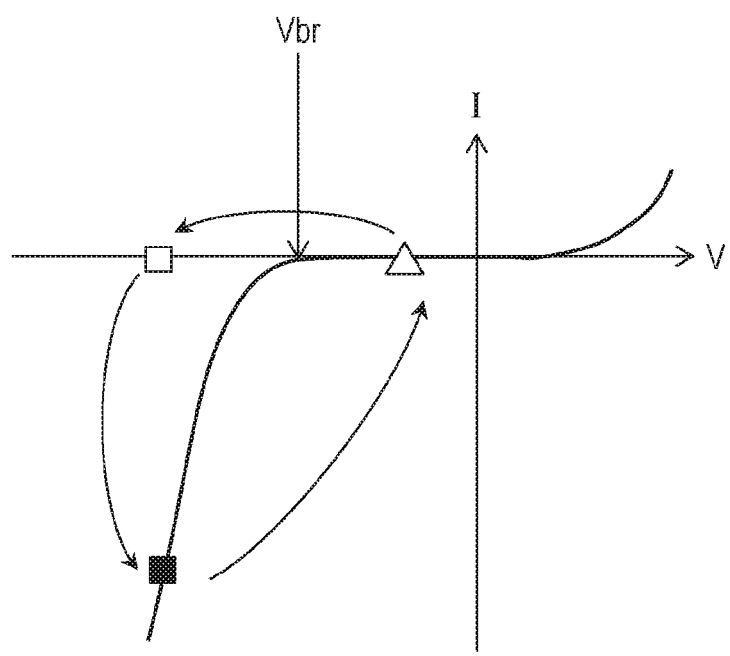
FIG. 4 is a graph showing an I-V curve of a common avalanche photodiode.

FIG. 4 shows an I-V curve of a common avalanche photodiode in a state in which light is not applied. As has already been described, the avalanche structure 120 has a configuration similar to that of a PIN-type silicon avalanche photodiode. For this reason, the avalanche structure 120 can exhibit the same I-V curve as that of a common avalanche photodiode.

(Step 1)

In the configuration illustrated in FIG. 2, the voltage supply circuit 190 is connected between the first electrode 130B and the second electrode 140. In Geiger mode, light detection is executed under a reverse bias above a breakdown voltage Vbr. At the time of light detection, a reverse bias above the breakdown voltage Vbr is first applied to the avalanche structure 120 by the voltage supply circuit 190. In other words, the second electrode 140 is set to a higher potential than that of the first electrode 130B.

As shown in FIG. 4, avalanche breakdown occurs under a reverse bias above the breakdown voltage Vbr in an avalanche photodiode. However, gradual voltage application makes it possible to apply a reverse bias above the breakdown voltage Vbr to the avalanche photodiode while preventing current from flowing between an anode and a cathode. In the following description, a state without avalanche breakdown even under a reverse bias above the breakdown voltage will be referred to as a "metastable state" for the sake of convenience. In FIG. 4, an operating point corresponding to the metastable state is indicated by a white rectangle "□".

(Step 2)

When light of a wavelength, for which a first material exhibits absorption, enters the photoelectric conversion structure 110 of the photodetection element 100B, in which the avalanche structure 120 is in the metastable state, a pair of positive and negative charges (typically, a hole-electron pair) is generated through photoelectric conversion. Either one of the positive and negative charges which are generated enters from the photoelectric conversion structure 110 into the avalanche structure 120 with a certain probability.

(Step 3)

The charge after the entry from the photoelectric conversion structure 110 into the avalanche structure 120 is accelerated by an electric field produced due to a difference in applied potential between the first electrode 130B and the second electrode 140 to cause an electron avalanche. Positive and negative charges newly generated inside the avalanche structure 120 transfer toward the first electrode 130B and the second electrode 140, respectively. As a result, a macroscopic current pulse is output from the photodetection element 100B.

In the graph in FIG. 4, a black rectangle "■" represents an operating point corresponding to the avalanche breakdown state. A transition of the avalanche structure 120 in the metastable state to the avalanche breakdown state is a rapid transition. As described above, a charge after transfer from the photoelectric conversion structure 110 into the avalanche structure 120 serves as a trigger which causes the avalanche structure 120 to transit from the metastable state to a state in which a breakdown current flows. Observation of the current pulse output from the photodetection element 100B due to avalanche breakdown allows detection of light incidence. The quenching circuit 192 detects a current resulting from the avalanche breakdown and outputs, for example, a signal indicating photon detection. Since a transition from the metastable state to the avalanche breakdown state also occurs as a result of incidence of a single photon, a single photon can be detected in a detection mode using the metastable state.

(Step 4)

In a state in which the avalanche breakdown is going on, even if a photon further enters the photoelectric conversion structure 110, and a charge newly generated through photoelectric conversion enters further into the avalanche structure 120, the photon cannot be detected. For this reason, after the detection of the current pulse, quenching that reduces the potential difference between the first electrode 130B and the second electrode 140 to a magnitude, at which a breakdown current does not flow, is executed. The quenching circuit 192 supplies a bias for quenching to the photodetection element 100B.

In FIG. 4, a white triangle "Δ" indicates an operating point after the quenching. After that, a reverse bias above the breakdown voltage Vbr is applied again between the first electrode 130B and the second electrode 140, which restores the avalanche structure 120 to the metastable state. For example, if an active mechanism is used as the quenching circuit 192, the quenching circuit 192 typically includes a circuit which applies a voltage above the breakdown voltage Vbr between the first electrode 130B and the second electrode 140. The active mechanism raises the reverse bias to be applied to the avalanche structure 120 to a voltage above the breakdown voltage Vbr by the action of, for example, a current detecting amplifier and restores the avalanche structure 120 to the metastable state. With the restoration, the photodetection element 100B is restored to a state standing by for detection. If a passive mechanism is used as the quenching circuit 192, quenching and restoration to the metastable state are automatically executed.

By repetition of the above-described cycle, light detection in Geiger mode is executed. In Geiger mode, even if the number of holes or electrons which transfer from the photoelectric conversion structure 110 to the avalanche structure 120 is one, a transition from the metastable state to the avalanche breakdown state can occur. That is, even incidence of a single photon on the photoelectric conversion structure 110 can cause a transition from the metastable state to the avalanche breakdown state. As described above, in a detection mode using the metastable state, a single photon can be detected. A photodetection element according to the embodiment of the present disclosure can exhibit sufficient sensitivity for light detection.

As described above, in the second embodiment, the photoelectric conversion structure 110 is arranged so as to be located neither on the first straight line L1 nor on the second straight line L2. For this reason, a charge traveling toward the first electrode 130B or the second electrode 140 in accordance with an electric field does not pass through the photoelectric conversion structure 110. Alternatively, the proportion of charges passing through the photoelectric conversion structure 110 to charges traveling toward the first electrode 130B or the second electrode 140 can be reduced. The probability that a charge is trapped in a certain region in a structure is proportional to the number of charges passing through the region. In the second embodiment, since there is no charge passing through the photoelectric conversion structure 110 or the proportion of such charges is small, even if the photoelectric conversion structure 110 is composed of a material which may produce relatively numerous traps, the probability that a charge is trapped in the photoelectric conversion structure 110 is lower. Meanwhile, the avalanche structure 120, to which most of a breakdown current flows, is composed of monocrystalline silicon with a low trap density. Even if a large quantity of charges pass through the avalanche structure 120, charges are unlikely to be trapped. Thus, generation of an afterpulse in the case of operation in Geiger mode can be effectively inhibited. An afterpulse is the biggest factor in reducing an S/N ratio in light detection using Geiger mode, and the embodiment of the present disclosure allows inhibition of reduction in the S/N ratio. According to the embodiment of the present disclosure, a false signal can be beneficially reduced in detection of light of a wavelength longer than that of visible light.

(Modification)

Figure 5:
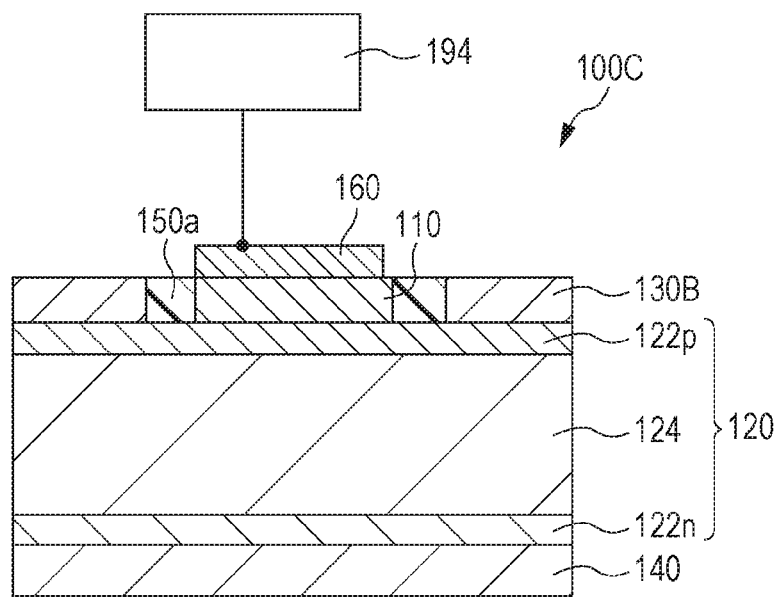
FIG. 5 is a view showing a device structure of a modification of the photodetection element according to the second embodiment.

FIG. 5 shows a device structure of a modification of the photodetection element according to the second embodiment of the present disclosure. A main difference between a photodetection element 100C shown in FIG. 5 and the photodetection element 100B described with reference to FIG. 2 is that the photodetection element 100C further includes a third electrode 160 and a reset circuit 194. As shown in FIG. 5, the third electrode 160 is located on the opposite side of the photoelectric conversion structure 110 from the avalanche structure 120. In this example, the third electrode 160 is in direct contact with the photoelectric conversion structure 110. Although the reset circuit 194 is electrically connected to the third electrode 160 here, the reset circuit 194 may be electrically connected to the first electrode 130B or the second electrode 140, as will be described later. The reset circuit 194 can be a part of the voltage supply circuit 190 described above.

As described above, during operation in Geiger mode, a transition of the avalanche structure 120 from a metastable state to an avalanche breakdown state can occur even if the number of holes or electrons which transfer from the photoelectric conversion structure 110 to the avalanche structure 120 is one. For this reason, one of positive and negative charges generated through photoelectric conversion may transfer to the avalanche structure 120, and the photodetection element 100C may be restored to a state standing by for detection while the other remains inside the photoelectric conversion structure 110. In other words, next detection may be executed in a state in which the photoelectric conversion structure 110 is electrified. If the photoelectric conversion structure 110 can be diselectrified, effects of electrification on light detection can be avoided, which is beneficial.

The photoelectric conversion structure 110 can be diselectrified by releasing a counter charge left in the photoelectric conversion structure 110 into the outside or injecting a charge opposite in sign to the counter charge into the photoelectric conversion structure 110 to cause the charges to recombine together. For example, assume that a negative charge of positive and negative charges generated through photoelectric conversion transfers to the avalanche structure 120 and that the positive charge remains as a counter charge in the photoelectric conversion structure 110. In a case where the polarity of charges left in the photoelectric conversion structure 110 is positive, if negative charges are injected into the photoelectric conversion structure 110, and a state in which the charges opposite in polarity to the counter charges are injected in the photoelectric conversion structure 110 is maintained over a certain period, the charges recombine together to diselectrify the photoelectric conversion structure 110.

Such injection of charges into the photoelectric conversion structure 110 can be performed by adjusting a potential difference between the photoelectric conversion structure 110 and a region which functions as a supplier of charges opposite in polarity to counter charges inside the photoelectric conversion structure 110. In the example shown in FIG. 5, since the reset circuit 194 is connected to the photoelectric conversion structure 110 via the third electrode 160, charges opposite in polarity to counter charges can be supplied from the reset circuit 194 to the photoelectric conversion structure 110 by adjusting a voltage to be applied from the reset circuit 194 to the third electrode 160. Reset operation of supplying charges opposite in polarity to counter charges to the photoelectric conversion structure 110 can be executed, for example, with each photon detection, that is, each restoration to the metastable state. The reset operation may be executed before restoration to the metastable state or simultaneously with or before quenching.

Figure 6:
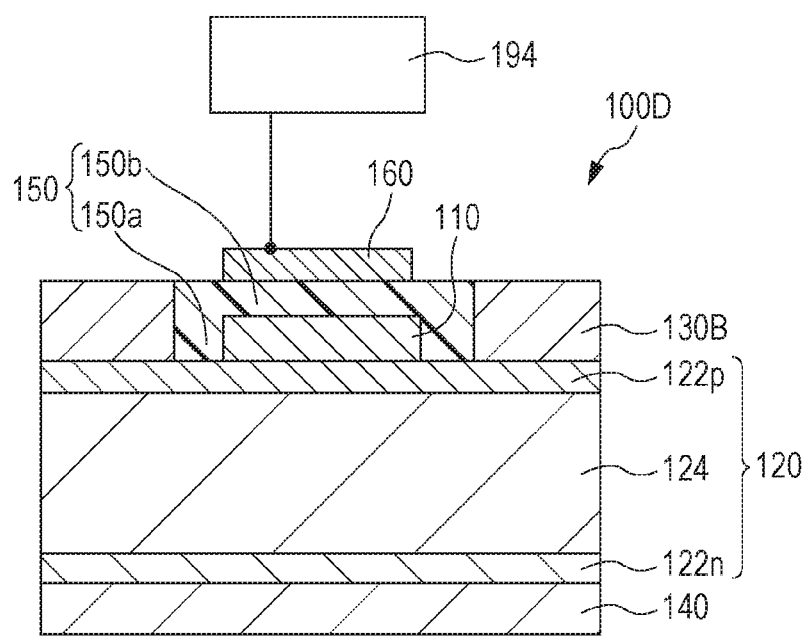
FIG. 6 is a view showing a device structure of another modification of the photodetection element according to the second embodiment.

FIG. 6 shows a device structure of another modification of the photodetection element according to the second embodiment of the present disclosure. A photodetection element 100D shown in FIG. 6 includes a third electrode 160 and a reset circuit 194, like the photodetection element 100C shown in FIG. 5. The photodetection element 100D is also the same as the photodetection element 100C shown in FIG. 5 in that the third electrode 160 is located on the opposite side of the photoelectric conversion structure 110 from the avalanche structure 120. Note that, in this example, the first electrode 130B is thicker than the photoelectric conversion structure 110 and that the photoelectric conversion structure 110 is covered with a dielectric region 150. The dielectric region 150 includes the dielectric region 150a that is located between the first electrode 130B and the photoelectric conversion structure 110 and a dielectric region 150b which is located between the third electrode 160 and the photoelectric conversion structure 110.

In the configuration illustrated in FIG. 6, the third electrode 160 is arranged on the dielectric region 150 and is not in direct contact with the photoelectric conversion structure 110. Note that the dielectric region 150b functions as a capacitor at the time of applying a reset voltage from the reset circuit 194 to the third electrode 160. For this reason, the application of the reset voltage to the third electrode 160 allows adjustment of a potential of the photoelectric conversion structure 110 via the dielectric region 150b as a capacitor. In other words, a counter charge in the photoelectric conversion structure 110 can be canceled out without directly injecting a charge from the third electrode 160 into the photoelectric conversion structure 110. As compared with the configuration shown in FIG. 5, the configuration illustrated in FIG. 6 is capable of inhibiting unintentional injection of charges from the third electrode 160 into the photoelectric conversion structure 110 and inhibiting generation of a false signal because there are no direct exchanges of charges between the third electrode 160 and the photoelectric conversion structure 110.

With the above-described configuration, for example, a charge opposite in polarity to a counter charge in the photoelectric conversion structure 110 can be supplied from the avalanche structure 120 to the photoelectric conversion structure 110. If a negative charge is desired to be injected into the photoelectric conversion structure 110, a reset voltage which makes the potential of the photoelectric conversion structure 110 relatively higher than that on the avalanche structure 120 side may be supplied from the reset circuit 194. If a positive charge is desired to be injected into the photoelectric conversion structure 110, a reset voltage which makes the potential of the photoelectric conversion structure 110 relatively lower than that on the avalanche structure 120 side may be supplied from the reset circuit 194.

A reset voltage to be supplied from the reset circuit 194 to the third electrode 160 can be a voltage which makes a potential of the third electrode 160 higher than that of the first electrode 130B as a reference or a voltage which makes the potential of the third electrode 160 lower than that of the second electrode 140 as a reference. In reset operation, a charge opposite in polarity to a counter charge is supplied from the avalanche structure 120 to the photoelectric conversion structure 110. Alternatively, a counter charge is drawn from the photoelectric conversion structure 110 into the avalanche structure 120. Since the avalanche structure 120 has a connection to the first electrode 130B and the second electrode 140, a charge injected from the avalanche structure 120 into the photoelectric conversion structure 110 may be a charge derived from an external power source which is connected to the first electrode 130B or the second electrode 140.

The third electrode 160 is typically a transparent electrode which is formed from a TCO, such as ITO. A material for forming the third electrode 160 is not limited to a TCO, and a metal film, such as an Au thin film, can be used as the third electrode 160 as long as necessary sensitivity can be secured. Although the third electrode 160 covers a whole upper surface of the photoelectric conversion structure 110 in this example, covering the whole upper surface of the photoelectric conversion structure 110 is not required.

As described above, the reset circuit 194 supplies a reset voltage which diselectrifies the photoelectric conversion structure 110 to the third electrode 160. Restoration to a metastable state after a step of diselectrifying the photoelectric conversion structure 110 allows detection of a next photon in the same state as at the time of first photon detection. Note that the reset circuit 194 may be electrically connected to the first electrode 130B or the second electrode 140. The reset circuit 194 may be configured to, for example, apply a reset voltage which makes the potential of the first electrode 130B higher than that of the second electrode 140 as a reference to at least one of the first electrode 130B and the second electrode 140. That is, reset operation may be executed by applying a forward bias across the first electrode 130B and the second electrode 140.

The reset circuit 194 is not limited to a particular power circuit, like the voltage supply circuit 190. The reset circuit 194 may be a part of the quenching circuit 192 or a separate circuit independent of the voltage supply circuit 190. The reset circuit 194 may perform potential operation that draws a counter charge inside the photoelectric conversion structure 110 into the avalanche structure 120. The counter charge drawn from the photoelectric conversion structure 110 can be collected by the first electrode 130B or the second electrode 140.

It is obvious that the photodetection element according to the second embodiment is operable not only in Geiger mode but also in linear mode. The photoelectric conversion structure 110 can be diselectrified by using the above-described reset operation in linear mode.

Third Embodiment

Figure 7:
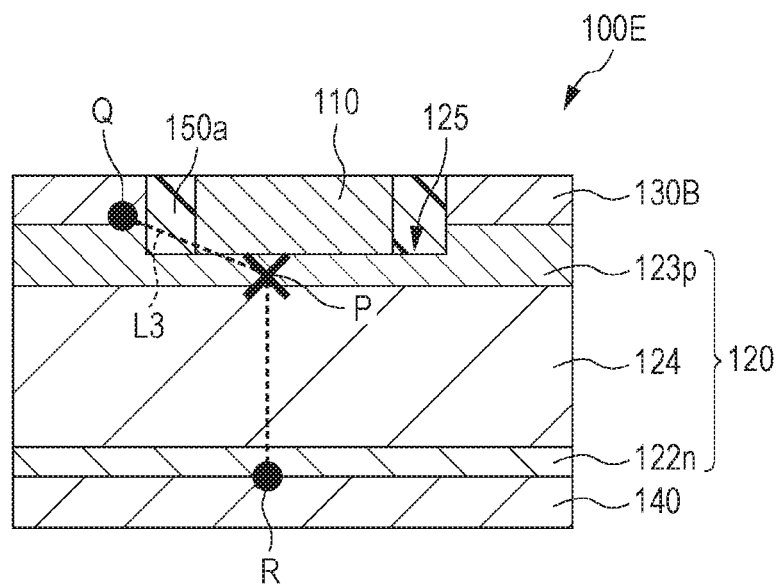
FIG. 7 is a view showing an exemplary device structure of a photodetection element according to a third embodiment.

FIG. 7 shows an exemplary device structure of a photodetection element according to a third embodiment of the present disclosure. Like the second embodiment, the photodetection element according to the third embodiment also has a configuration more beneficial to reduction in afterpulse.

A main difference between a photodetection element 100E shown in FIG. 7 and the photodetection element 100B described with reference to FIG. 2 is that an avalanche structure 120 of the photodetection element 100E includes a heavily doped P-type region 123p, in which a recess 125 is formed, instead of the heavily doped P-type region 122p and that a photoelectric conversion structure 110 is arranged on a bottom of the recess 125. Note that although a surface of the photoelectric conversion structure 110 is exposed from a dielectric region 150a in this example, the exposition of the surface of the photoelectric conversion structure 110 from the dielectric region 150a is not required. If a dielectric region is composed of a material which can transmit light of a wavelength targeted for detection, the surface of the photoelectric conversion structure 110 may be covered with the dielectric region.

In the configuration illustrated in FIG. 7, the photoelectric conversion structure 110 is not located between a first electrode 130B and a second electrode 140, like the second embodiment. As schematically shown in FIG. 7, assume that an arbitrary point P is set inside the avalanche structure 120. In this case, a group of first straight lines which connect the point P and a point Q located inside the first electrode 130B and closest to the point P and a group of second straight lines which connect the point P and a point R located inside the second electrode 140 and closest to the point P can include a straight line which crosses the photoelectric conversion structure 110. A straight line L3 shown in FIG. 7 is an example of the straight line. At least a part of the dielectric region 150a is located on a straight line which crosses the photoelectric conversion structure 110 like the straight line L3.

With the arrangement of the photoelectric conversion structure 110 and the dielectric region 150a, even if the photoelectric conversion structure 110 is located on a shortest path connecting the avalanche structure 120 and the first electrode 130B or the second electrode 140, at least a part of the dielectric region 150a is located on the path. For this reason, transfer of a charge along the path can be prevented, and crossing of the photoelectric conversion structure 110 by a charge which triggers an electron avalanche or a charge which is accelerated in accordance with an internal electric field produced between the first electrode 130B and the second electrode 140 as a result of application of a reverse bias is avoided. That is, charges passing through the photoelectric conversion structure 110 can be reduced, and the probability of charges being trapped in the photoelectric conversion structure 110 can be reduced. As a result, it is possible to inhibit generation of an afterimage and an afterpulse while achieving high sensitivity.

The recess 125 in the heavily doped P-type region 123p can be formed by, for example, forming a lightly doped region 124 and the heavily doped P-type region 123p through epitaxial growth and then removing a part of a surface of the heavily doped P-type region 123p through etching. Alternatively, the recess 125 can be formed by forming in advance a mask pattern of a silicon oxide film or the like on a silicon surface and selectively causing monocrystals to grow in a portion exposed from the mask of the silicon surface.

(Modification)

In each of the embodiments of the present disclosure, direct contact of the photoelectric conversion structure 110 with the avalanche structure 120 is not required. The photoelectric conversion structure 110 and the avalanche structure 120 only need to be arranged such that a charge generated in the photoelectric conversion structure 110 can transfer to the avalanche structure 120. A layer having a charge transport function or the like can be further arranged between the photoelectric conversion structure 110 and the avalanche structure 120.

Figure 8:
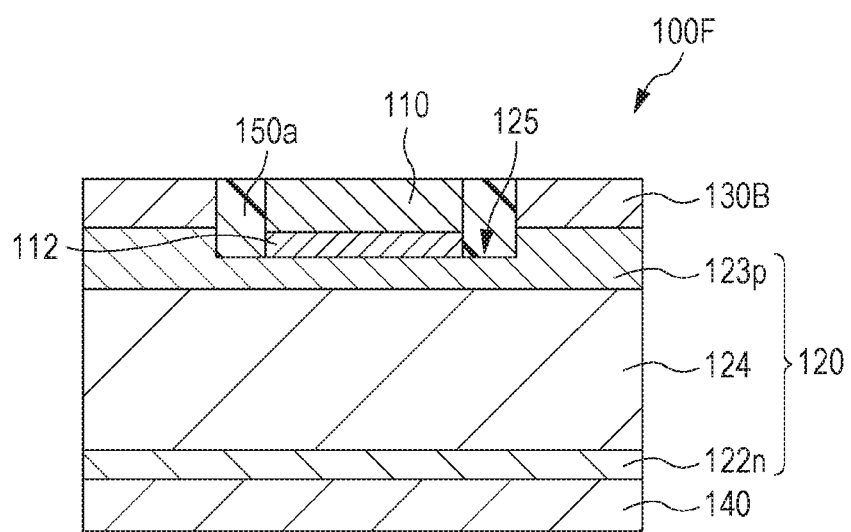
FIG. 8 is a view showing a device structure of a modification of the photodetection element according to the third embodiment.

FIG. 8 shows a device structure of a modification of the photodetection element according to the third embodiment of the present disclosure. A photodetection element 100F shown in FIG. 8 includes a charge transport layer 112 which is arranged between the photoelectric conversion structure 110 and the avalanche structure 120. Here, the photoelectric conversion structure 110 is electrically connected to the avalanche structure 120 via the charge transport layer 112.

The charge transport layer 112 allows at least one of positive and negative charges generated through photoelectric conversion in the photoelectric conversion structure 110 to pass through. The charge transport layer 112 is a layer which functions as a conduction pathway, through which a charge generated inside the photoelectric conversion structure 110 transfers to the avalanche structure 120. A constituent material for the charge transport layer 112 may be either a metal or a semiconductor. The semiconductor may be a monocrystalline semiconductor or an organic semiconductor.

The charge transport layer 112 may be a transport layer which selectively allows one of positive and negative charges to pass through from the photoelectric conversion structure 110 to the avalanche structure 120. For example, an electron transport layer which selectively allows an electron to pass through toward the avalanche structure 120 may be used as the charge transport layer 112. In this case, the electron transport layer as the charge transport layer 112 may have a function of a hole blocking layer which inhibits holes from being injected from the avalanche structure 120 into the photoelectric conversion structure 110. The charge transport layer 112 may be a hole transport layer which selectively allows a hole to pass through toward the avalanche structure 120. One of positive and negative charges can be selectively transferred from the photoelectric conversion structure 110 to the avalanche structure 120 by using an electron transport layer or a hole transport layer as the charge transport layer 112.

Figure 9:
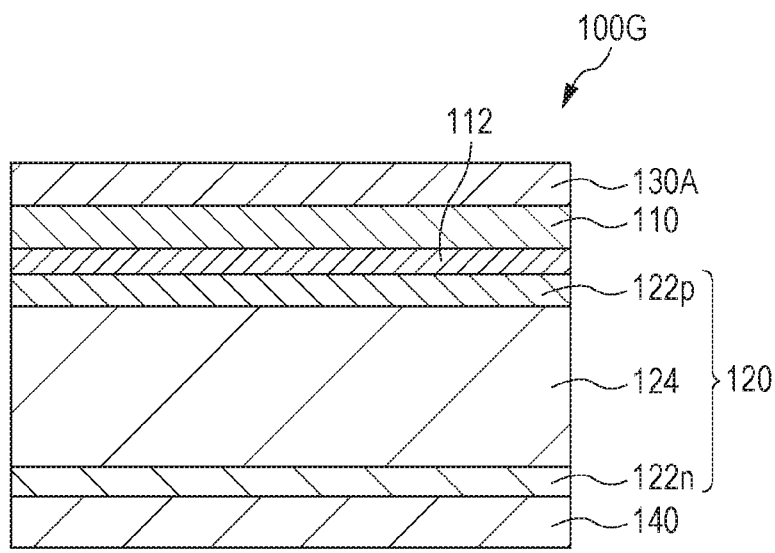
FIG. 9 is a view showing an example of a device structure of a photodetection element including a charge transport layer between a photoelectric conversion structure and an avalanche structure.
Figure 10:
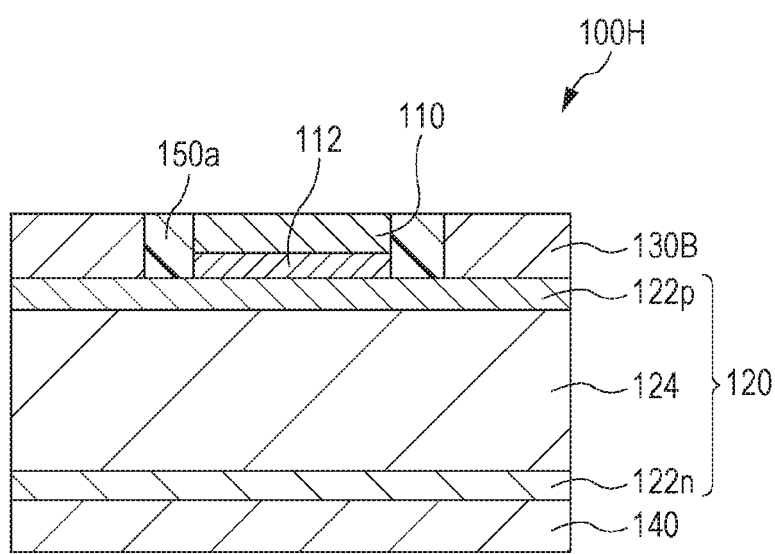
FIG. 10 is a view showing another example of the device structure of the photodetection element including the charge transport layer between the photoelectric conversion structure and the avalanche structure.

Such an electron transport layer may be applied to the configurations illustrated in FIGS. 1 and 2. For example, the charge transport layer 112 may be further arranged between the photoelectric conversion structure 110 and the avalanche structure 120, like a photodetection element 100G shown in FIG. 9 and a photodetection element 100H shown in FIG. 10. As with the configuration described with reference to FIG. 2, the photoelectric conversion structure 110 of the photodetection element 100H is arranged so as to be located neither on a first straight line which connects an arbitrary point P inside the avalanche structure 120 and a closest point Q inside the first electrode 130B nor on a second straight line which connects the point P and a closest point R inside the second electrode 140. This allows reduction in the probability of charges being trapped in the photoelectric conversion structure 110 and more effective inhibition of generation of an afterpulse during operation in Geiger mode.

Figure 11:
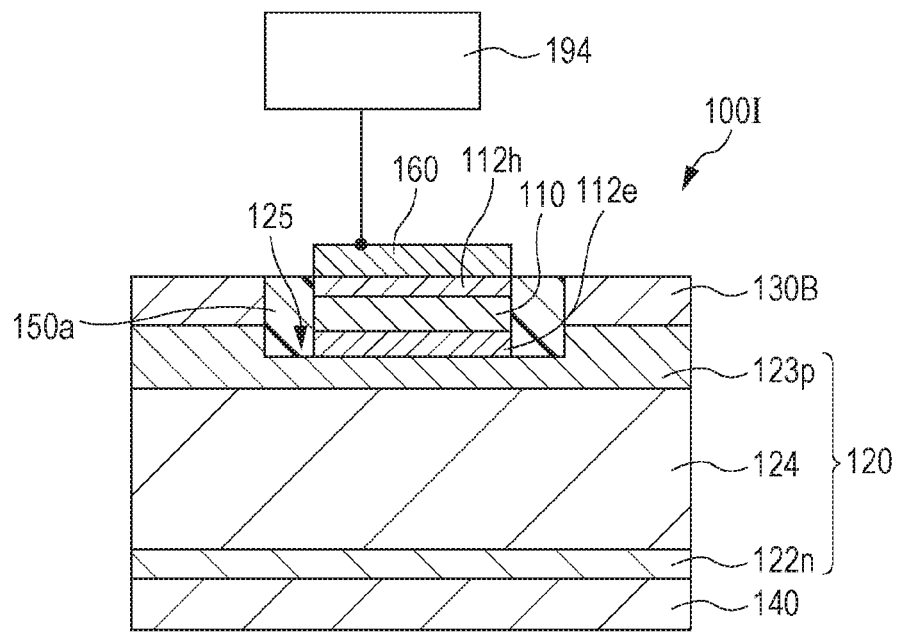
FIG. 11 is a view showing a device structure of another modification of the photodetection element according to the third embodiment.

FIG. 11 shows a device structure of another modification of the photodetection element according to the third embodiment of the present disclosure. A main difference between a photodetection element 100I shown in FIG. 11 and the photodetection element 100E described with reference to FIG. 7 is that the photodetection element 100I includes a first charge transport layer 112e and a third electrode 160 and further includes a second charge transport layer 112h which is sandwiched between the third electrode 160 and the photoelectric conversion structure 110. As shown in FIG. 11, the third electrode 160 is connected to a reset circuit 194.

The first charge transport layer 112e that is located between the photoelectric conversion structure 110 and the avalanche structure 120 can be an electron transport layer which selectively allows an electron to pass through from the photoelectric conversion structure 110 to the avalanche structure 120. In this case, the second charge transport layer 112h that is located between the photoelectric conversion structure 110 and the third electrode 160 can be a hole transport layer which selectively allows a hole to pass through from the photoelectric conversion structure 110 to the third electrode 160. With the above-described configuration, one of positive and negative charges generated in the photoelectric conversion structure 110 can be selectively transferred from the photoelectric conversion structure 110 to the avalanche structure 120. In the example, an electron can be selectively transferred from the photoelectric conversion structure 110 to the avalanche structure 120.

As will be described later, in the configuration illustrated in FIG. 11, the reset circuit 194 is configured to apply a fixed voltage to the third electrode 160 when the photodetection element 100I is in operation. Application of, for example, a fixed negative voltage from the reset circuit 194 to the third electrode 160 allows the other of positive and negative charges generated in the photoelectric conversion structure 110, that is, a hole here to be released from the photoelectric conversion structure 110 into the third electrode 160. Thus, the configuration illustrated in FIG. 11 can prevent a counter charge from remaining in the photoelectric conversion structure 110 and can omit the above-described reset operation.

Note that the example shown in FIG. 11 has a configuration in which a negative one of positive and negative charges generated in the photoelectric conversion structure 110 can be selectively transferred from the photoelectric conversion structure 110 to the avalanche structure 120. If a hole transport layer is used as the first charge transport layer 112e, and an electron transport layer is used as the second charge transport layer 112h, a positive one of positive and negative charges generated in the photoelectric conversion structure 110 can be selectively transferred from the photoelectric conversion structure 110 to the avalanche structure 120.

Here, an electron transport layer is a layer which has the property of allowing electron transfer from the photoelectric conversion structure 110 to a region connected to the photoelectric conversion structure 110 via the electron transport layer but blocking passage of a hole or significantly reducing the probability of hole transfer. A material for forming a common hole blocking layer can be used as a material for the first charge transport layer 112e as an electron transport layer. An example of the material is $C_{60}$. The first charge transport layer 112e can be caused to function as an electron transport layer by forming the first charge transport layer 112e using a material deeper in HOMO level and LUMO level than a first material contained in the photoelectric conversion structure 110.

Meanwhile, a hole transport layer is a layer which has the property of allowing hole transfer from the photoelectric conversion structure 110 to a region connected to the photoelectric conversion structure 110 via the hole transport layer but blocking passage of an electron or significantly reducing the probability of electron transfer. A material for forming a common electron blocking layer can be used as a material for the second charge transport layer 112h as a hole transport layer. An example of the material is TFB. The second charge transport layer 112h can be caused to function as a hole transport layer by forming the second charge transport layer 112h using a material shallower in HOMO level and LUMO level than the first material contained in the photoelectric conversion structure 110.

(Operation by Photodetection Element 100I)

Like the second embodiment, the photodetection element according to the third embodiment is operable in either linear mode or Geiger mode and is particularly beneficial to inhibition of an afterpulse during operation in Geiger mode. An overview of operation in Geiger mode by the photodetection element 100I shown in FIG. 11 will be described below.

(Step 1)

For example, a voltage supply circuit 190 is connected between the first electrode 130B and the second electrode 140 to apply a reverse bias above a breakdown voltage Vbr to the avalanche structure 120. At this time, the voltage application is gradually performed, which puts the avalanche structure 120 into a metastable state.

(Step 2)

When light of a wavelength, for which the first material exhibits absorption, enters the photoelectric conversion structure 110, for example, a hole-electron pair is generated inside the photoelectric conversion structure 110 through photoelectric conversion. Here, the first charge transport layer 112e inhibits entry of the hole of the hole and electron into the avalanche structure 120 and allows the electron to pass through. Thus, the electron of the hole and electron transfers selectively to the avalanche structure 120, and the electron after the transfer to the avalanche structure 120 acts as a trigger for a transition from the metastable state to an avalanche breakdown state. In contrast, the second charge transport layer 112h allows the hole to pass through while inhibiting entry of the electron into the third electrode 160.

While in operation, the reset circuit 194 applies a reset voltage which makes a potential of the third electrode 160 lower than that of the photoelectric conversion structure 110 to the third electrode 160. The third electrode 160 can collect a hole of the hole and an electron using the third electrode 160 by making the third electrode 160 lower in potential than the photoelectric conversion structure 110. In other words, a hole as a counter charge can be prevented from remaining in the photoelectric conversion structure 110, and electrification of the photoelectric conversion structure 110 can be avoided.

(Step 3)

Light incidence can be detected by detecting output of a macroscopic current pulse due to the transition from the metastable state to the avalanche breakdown state by, for example, a quenching circuit 192.

(Step 4)

After the detection of the current pulse, the quenching circuit 192 reduces a potential difference between the first electrode 130B and the second electrode 140 to a magnitude, at which a breakdown current does not flow. With the quenching, the photodetection element 100I is restored to a state standing by for detection. As described above, the configuration illustrated in FIG. 11 can prevent a counter charge from remaining in the photoelectric conversion structure 110 without separately providing a reset step.

Figure 12:
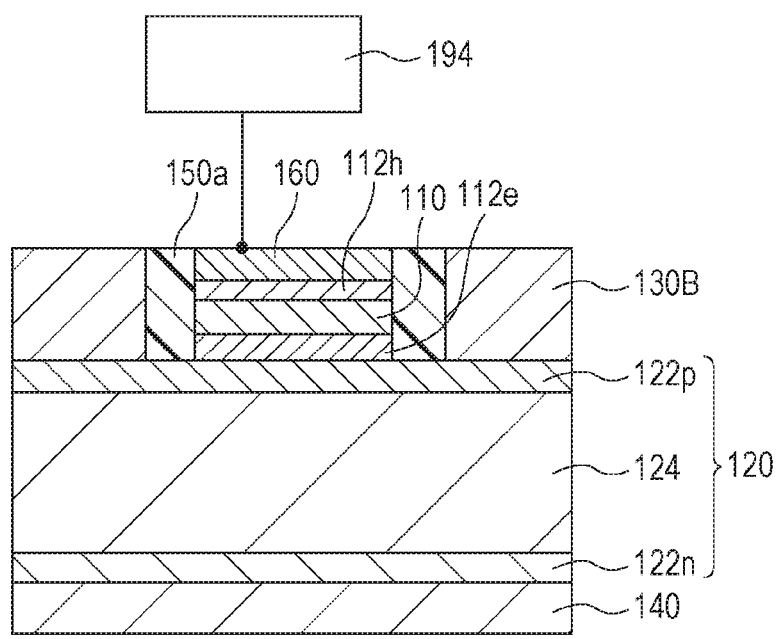
FIG. 12 is a view showing a device structure of still another modification.

As has been described above, according to the embodiment of the present disclosure, a photodetection element which utilizes an avalanche effect and has reduced effects of an afterimage and an afterpulse while achieving high sensitivity is provided. The embodiment of the present disclosure is not limited to the above-described examples and may be variously altered. As shown in FIG. 12, a configuration, obtained by arranging the first charge transport layer 112e and the second charge transport layer 112h on the avalanche structure 120 side and on the third electrode 160 side, respectively, of the photoelectric conversion structure 110 with the configuration described with reference to FIG. 5, is also possible. With the above-described configuration, electrification of the photoelectric conversion structure 110 can be avoided without separately providing a reset step, like the configuration described with reference to FIG. 11.

Fourth Embodiment

Figure 15:
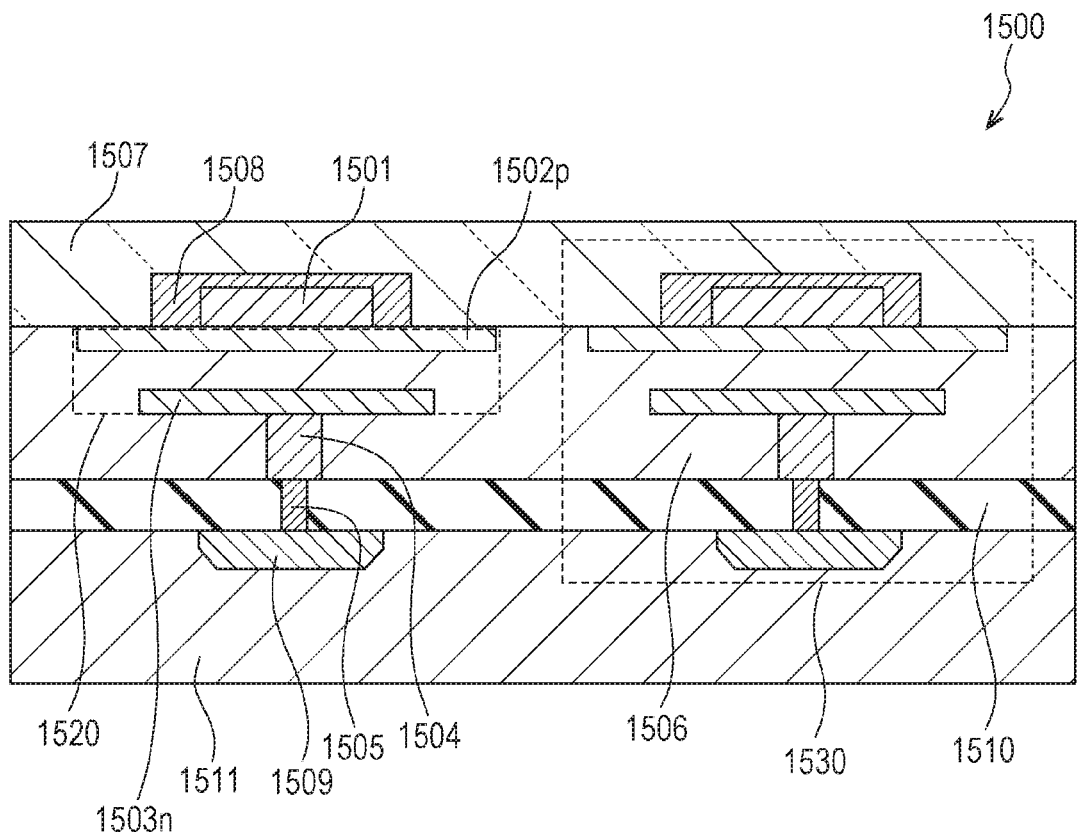
FIG. 15 is a view showing an exemplary device structure of a photodetection element according to a fourth embodiment.

FIG. 15 shows an exemplary device structure of a photodetection element according to a fourth embodiment of the present disclosure. In the present embodiment, photodetection elements according to the present disclosure are integrated to constitute an image sensor 1500. The image sensor 1500 according to the present embodiment includes a plurality of pixels 1530. Each pixel 1530 includes a photoelectric conversion structure 1501, and a heavily doped P-type region 1502p and a heavily doped N-type region 1503n which are formed in a low-concentration region 1506. The heavily doped P-type region 1502p, the low-concentration region 1506, and the heavily doped N-type region 1503n constitute an avalanche structure 1520. Each pixel 1530 includes charge transport pathways 1504 and 1505 for transporting electrons collected in the heavily doped N-type region 1503n to a charge storer 1509. The pixel 1530 also includes a transparent electrode 1507 for collecting holes collected in the heavily doped P-type region 1502p. The transparent electrode 1507 and the photoelectric conversion structure 1501 are separated by a dielectric region 1508. The charge transport pathways 1505 of the pixels 1530 are insulated from one another by an insulating layer 1510.

Each pixel 1530 included in the present image sensor 1500 functions in the same manner as in the photodetection element shown in FIG. 2. Each pixel has the separate charge storer 1509 in a semiconductor substrate 1511. Image pickup can be performed by measuring charges stored in the charge storers 1509.

A method for driving each pixel 1530 is basically the same as in the case of an independent photodetection element, and a description thereof will be omitted.

In each of the embodiments according to the present disclosure, the avalanche structure 120 includes a monocrystalline silicon layer which causes avalanche multiplication. According to the embodiments of the present disclosure, for example, the avalanche structure 120 can be formed from a monocrystalline silicon substrate. It is thus relatively easy to integrate a control circuit including many transistors, a signal processing circuit, and the like on a monocrystalline silicon substrate which constitutes a whole or a part of the avalanche structure 120 by using a known semiconductor process. For example, it is also possible to form a quenching circuit on a monocrystalline silicon substrate constituting a whole or a part of the avalanche structure 120. Since high-speed complicated operation is required from the quenching circuit, it is beneficial to form a transistor included in the quenching circuit on the same monocrystalline silicon substrate constituting the whole or a part of the avalanche structure 120.

What is claimed is:

1. A photodetection element comprising:
   a first electrode;
   a second electrode;
   a photoelectric conversion structure that contains a first material, the first material generating positive and negative charges by absorbing a photon; and
   an avalanche structure that includes a monocrystalline silicon layer, in which avalanche multiplication occurs as a result of injection of at least one selected from the group consisting of the positive and negative charges from the photoelectric conversion structure, wherein
   the first material includes at least one selected from the group consisting of an organic semiconductor, a semiconductor-type carbon nanotube, and a semiconductor quantum dot,
   the avalanche structure includes
      a first region of a first conductivity type,
      a second region of a second conductivity type,
   the first electrode is in contact with the first region of the avalanche structure, and
   the second electrode is in contact with the second region of the avalanche structure.

2. The photodetection element according to claim 1, further comprising:
   a third electrode that is located on an opposite side of the photoelectric conversion structure from the avalanche structure.

3. The photodetection element according to claim 2, further comprising:
   a first charge transport layer that is arranged between the photoelectric conversion structure and the avalanche structure and selectively allows one of the positive and negative charges generated in the photoelectric conversion structure to pass through; and
   a second charge transport layer that is located between the photoelectric conversion structure and the third electrode and selectively allows the other of the positive and negative charges generated in the photoelectric conversion structure to pass through.

4. The photodetection element according to claim 1, wherein
   an absorption edge of the first material is located on a side longer in wavelength than an absorption edge of monocrystalline silicon.

5. The photodetection element according to claim 1, wherein
   the photoelectric conversion structure further contains a second material deeper in lowest unoccupied molecular orbital level than the first material or a third material shallower in highest occupied molecular orbital level than the first material.

6. A photodetection element array comprising:
   a plurality of pixels, wherein
   each of the pixels includes the photodetection element according to claim 1.

7. The photodetection element array according to claim 6, wherein
   each of the pixels includes a charge storage, and
   an image is formed by reading out charges stored in the charge storage from each of the pixels.

* * * * *